United States Patent [19]
Kawabe et al.

[11] Patent Number: 6,159,656
[45] Date of Patent: Dec. 12, 2000

[54] POSITIVE PHOTOSENSITIVE RESIN

[75] Inventors: Yasumasa Kawabe; Kenichiro Sato; Toshiaki Aoai, all of Shizuoka, Japan

[73] Assignee: Fuji Photo Film Co., Ltd., Kanagawa, Japan

[21] Appl. No.: 09/344,141

[22] Filed: Jun. 24, 1999

[30] Foreign Application Priority Data

| Jun. 26, 1998 | [JP] | Japan | ................................. | 10-180868 |
| Jul. 1, 1998 | [JP] | Japan | ................................. | 10-186271 |
| Jul. 1, 1998 | [JP] | Japan | ................................. | 10-186272 |
| Jul. 1, 1998 | [JP] | Japan | ................................. | 10-186273 |

[51] Int. Cl.$^7$ ............................. G06F 7/004; G06F 7/021
[52] U.S. Cl. ........................ 430/270.1; 430/170; 430/176; 430/905
[58] Field of Search ................................ 430/270.1, 905, 430/170, 176

[56] References Cited

U.S. PATENT DOCUMENTS

| 5,128,232 | 7/1992 | Thackeray et al. | ..................... 430/192 |
| 5,707,776 | 1/1998 | Kawabe et al. | ..................... 430/270.1 |
| 5,837,419 | 11/1998 | Ushirogouchi et al. | ............. 430/270.1 |
| 5,928,818 | 5/2000 | Mertesdorf et al. | ..................... 430/18 |
| 6,063,542 | 5/2000 | Hyeon et al. | ........................ 430/270.1 |

*Primary Examiner*—John S. Chu
*Attorney, Agent, or Firm*—Sughrue, Mion, Zinn, Macpeak & Seas, PLLC

[57] ABSTRACT

The present invention provides a positive photosensitive resin composition which, when exposed to far ultraviolet rays, in particular, ArF excimer laser light, shows excellent performances especially with respect to the residual film ratio, resist profile, resolution, and dry-etching resistance and does not pose the problem of development defects. The positive photosensitive resin composition comprising:

(A) a compound which generates an acid upon irradiation with actinic rays, (B) a polymer having specific structures represented by formula (Ia), (Ib), (Ic) or (Id) defined in the specification, (C) a nitrogen-containing basic compound, and (D) at least one of a fluorine type surfactant and a silicone type surfactant.

16 Claims, No Drawings

POSITIVE PHOTOSENSITIVE RESIN

FIELD OF THE INVENTION

The present invention relates to positive photosensitive resin compositions for use in the production of semiconductors, e.g., ICs, in the production of circuit boards for liquid crystals, thermal heads, etc., and in other photofabrication processes. More particularly, this invention relates to positive photosensitive resin compositions suitable for use in the fine processing of semiconductor elements for which short-wavelength energy rays, e.g., for ultraviolet rays, X-rays, or electron rays, are used, in particular, an ArF excimer laser is used.

BACKGROUND OF THE INVENTION

In integrated semiconductor circuits, the degree of integration has increased recently and LSIs and VLSIs have been put to practical use. With these trends, the minimum pattern line width in such integrated circuits has reached a sub-half-micron region and is decreasing further.

Because of the above, the photolithographic requirements for forming fine patterns are increasingly becoming severer. Known as one means for attaining finer patterns is to use an exposure light having a shorter wavelength in resist pattern formation.

For example, the i-ray (365 nm) emitted from a high-pressure mercury lamp has been used so far in the production of DRAMs having degrees of integration of up to 64 megabits. In processes for mass-producing 256-megabit DRAMs, KrF excimer laser light (248 nm) has come to be practically used as an exposure light substitute for i-ray. For use in producing DRAMs having a degree of integration of 1 gigabit or higher, exposure lights having even shorter wavelengths are being investigated and use of ArF excimer laser light (193 nm), $F_2$ excimer laser light (157 nm), X-rays, and electron beams is thought to be effective [see Takumi Ueno et al., "Tan-hacho Fotorejisuto Zairyo-ULSI Ni Muketa Bisaikako-(Short-wavelength Photoresist Materials—Fine Processing toward ULSIs-)", Bunshin Shuppan, 1988].

In particular, exposure with an ArF excimer laser is regarded as a next-generation exposure technique. There is hence a desire for the development of a resist which has high sensitivity, high resolution, and excellent dry-etching resistance and is suitable for exposure with an ArF excimer laser.

Conventional resist material sin extensive use for exposure to i-ray and KrF excimer laser light include resists which contain an aromatic polymer so as to obtain high resistance to dry etching. For example, novolak resists and chemical amplification type polyvinylphenol resists are known. However, due to the aromatic rings, which have been incorporated for the purpose of imparting dry-etching resistance, such resists transmit substantially no light in the wavelength range for ArF excimer laser light. Those conventional resists hence have a drawback in that it is difficult to irradiate a bottom layer of the resist film with the light, so that a pattern having satisfactory sectional shapes cannot be obtained.

A technique known as one measure for eliminating the problem concerning resist transparency is to use an aliphatic polymer containing no aromatic rings, e.g., poly(methyl methacrylate) (see *J. Vac. Sci. Technol.*, B9, 3357 (1991)). However, such a polymer is not expected to have sufficient dry-etching resistance and is hence incapable of practical use. Consequently, the most important subject in developing a resist material for exposure with an ArF excimer laser is to attain both improved transparency and high resistance to dry etching.

Under these circumstances, it has been reported in *Proc. SPIE*, 1672, 66 (1992) that a resist containing alicyclic hydrocarbon groups in place of aromatic rings is equal in dry-etching resistance to resists containing aromatic rings and shows reduced absorption at 193 nm. This report has led to recent enthusiastic investigations on the utilization of that kind of polymer.

Attempts have been made from long ago to apply a polymer having alicyclic hydrocarbon groups to resists. For example, JP-A-60-195542 (the term "JP-A" as used herein means an "unexamined published Japanese patent application"), JP-A-1-217453, and JP-A-2-59751 disclose norbornene polymers, and JP-A-2-146045 discloses various alkali-soluble resins having alicyclic hydrocarbon skeletons and maleic anhydride units.

JP-A-5-80515 discloses a copolymer of norbornene and an acrylic ester protected with an acid-decomposable group. JP-A-4-39665, JP-A-5-265212, JP-A-5-80515, and JP-A-7-234511 disclose copolymers having adamantane skeletons in side chains. JP-A-7-252324 and JP-A-9-221526 disclose polymeric compounds in which alicyclic hydrocarbon groups having 7 to 12 carbon atoms comprising a crosslinked cyclic hydrocarbon group have been bonded to side chains thereof; examples of such alicyclic hydrocarbon groups include tricyclo[5.2.1.02.6]decanedimethylene, tricyclo[5.2.1.02.6]decanediyl, norbornanediyl, norbornanedimethyl, and adamantanediyl groups. JP-A-7-199467 discloses a polymeric compound having tricyclodecanyl, dicyclopentenyl, dicyclopentenyloxyethyl, norbornyl, or cyclohexyl groups bonded to side chains thereof.

FP-A-9-325498 discloses a polymer having a main chain containing cyclohexane and isobornyl skeletons. JP-A-9-230595, JP-A-9-244247, JP-A-10-10739, WO 97-33198, EP 794458, and EP 789378 disclose polymers having a main chain containing any of various cycloolefins, e.g., dicycloolefins, incorporated therein. JP-A-8-82925 and JP-A-9-230597 disclose a preference for compounds having a terpenoid skeleton having a menthyl group or menthyl derivative group.

There also is a technique of adding a low-molecular dissolution inhibitor to thereby heighten resolution. JP-A-8-15865 discloses use of a t-butyl ester of androstane as a dissolution inhibitor, while JP-A-9-265177 discloses a low-molecular dissolution inhibitor comprising a norbornyl, adamantyl, decanyl, or cyclohexyl group and an acid-decomposable group bonded thereto. It has been reported in *Proc. SPIE*, 3049, 84 (1997) that use of an oligomer of t-butyl lithocholate as a dissolution inhibitor is effective in improving adhesion and contrast.

The conventional, chemical amplification type positive resists containing an aromatic polymer which are for use with a KrF excimer laser have a problem as reported, e.g., in *Prooc. SPIE*, 1672, 46 (1992), *Prooc. SPIE*, 2438, 551 (1995), *Prooc. SPIE*, 2438, 563 (1995), *Prooc. SPIE*, 1925 14 (1993), *J. Photopolym. Sci. Tech.*, Vol.8, No.4, 535 (1995), *J. Photopolym. Sci. Tech.*, Vol.5, No.1, 207 (1992), *J. Photopolym. Sci. Tech.*, Vol.8, No.4, 561 (1995), and *Jpn. J. Appl. Phys.*, 33, 7023 (1994). The problem is that as the standing period of from exposure to heat treatment (PEB) becomes longer, the acid which has generated diffuses or the acid present on the resist surface is deactivated by basic impurities present in the atmosphere. As a result, the resist has impaired sensitivity and gives, through development, resist patterns which are not uniform in profile and line width.

A known technique for eliminating the above problem is to add an amine to a chemical amplification type resist containing an aromatic polymer. This technique is disclosed in many documents including JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266220, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274313, JP-A-9-166871, JP-A-9-292708, JP-A-9-325496, JP-A(PCT)-7-508840 (the term "JP-A(PCT)" as used herein means an "unexamined published Japanese patent application in PCT"), and U.S. Pat. Nos. 5,525,453, 5,629,134, and 5,667,938.

When any of the amines the use of which is disclosed in the above references is added to a chemical amplification type resist for exposure to ArF excimer laser light which contains a nonaromatic polymer having a main chain structure comprising alicyclic hydrocarbon units, then this addition is effective in diminishing the change in sensitivity and in obtaining, through development, resist patterns more uniform in profile and line width, as in the case of resists containing an aromatic polymer. However, the addition of those amines to such resists containing an alicyclic polymer results in exceedingly poor performance with respect to image defects. An effective measure for this has been desired.

SUMMARY OF THE INVENTION

An object of the present invention, which has been achieved in view of the above problems, is to provide positive photosensitive resin compositions which, when exposed to far ultraviolet rays, in particular, ArF excimer laser light, show excellent performances especially with respect to the residual film ratio, resist profile, resolution, and dry-etching resistance and do not pose the problem of development defects.

The present inventors made intensive investigations on constituent materials for chemical amplification type positive resist compositions. As a result, it has been found that the above object is accomplished by using a polymer containing an alicyclic hydrocarbon skeleton having a specific structure, a photo-acid generator, a nitrogen-containing basic compound, and at least one of a fluorine type surfactant and a silicone type surfactant.

The present invention includes the following constitutions.

(1) A positive photosensitive resin composition comprising:
(A) a compound which generates an acid upon irradiation with actinic rays,
(B) a polymer having a partial structure represented by the following general formula (Ia),
(C) a nitrogen-containing basic compound, and
(D) at least one of a fluorine type surfactant and a silicone type surfactant:

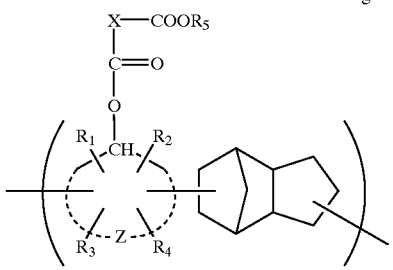

general formula (Ia)

wherein $R_1$ to $R_4$ each independently represents a hydrogen atom, a hydroxyl group, a carboxyl group, an alkyl group, an alkoxy group, a substituted alkyl group, a substituted alkoxy group, or a cycloalkyl group, provided that either $R_1$ and $R_3$ or $R_2$ and $R_4$ may be bonded to each other to form a ring;

X represents a bivalent organic group having 2 to 20 carbon atoms;

$R^5$ represents a hydrogen atom, an alkyl group, a substituted alkyl group, a cycloalkyl group, a substituted cycloalkyl group, or such a group that the —COOR$_5$ functions as a group which decomposes by the action of an acid; and Z represents a group of atoms which forms a cyclohexane or decalin ring in cooperation with the carbon atom.

(2) The positive photosensitive resin composition as described in (1) above wherein the polymer (B) has groups which decompose by the action of an acid.

(3) The positive photosensitive resin composition as described in (1) above which contains a low-molecular, acid-decomposable, dissolution inhibitive compound having a molecular weight of 2,000 or lower which has one or more groups decomposable by the action of an acid and comes to have enhanced alkali solubility by the action of an acid.

(4) The positive photosensitive resin composition as described in any one of (1) to (3) above wherein the actinic rays are far ultraviolet rays having a wavelength of 220 nm or shorter.

The present inventors made intensive investigations on constituent materials for chemical amplification type positive resist compositions. As a result, it has been found that the above object is accomplished by using a combination of a polymer containing a specific alicyclic hydrocarbon skeleton structure, a photo-acid generator, a nitrogen-containing basic compound, and at least one of a fluorine type surfactant and a silicone type surfactant.

The present invention further includes the following constitutions.

(5) A positive photosensitive resin composition comprising:
(A) a compound which generates an acid upon irradiation with actinic rays,
(B) a polymer having a partial structure represented by the following general formula (Ib),
(C) a nitrogen-containing basic compound, and
(D) at least one of a fluorine type surfactant and a silicone type surfactant:

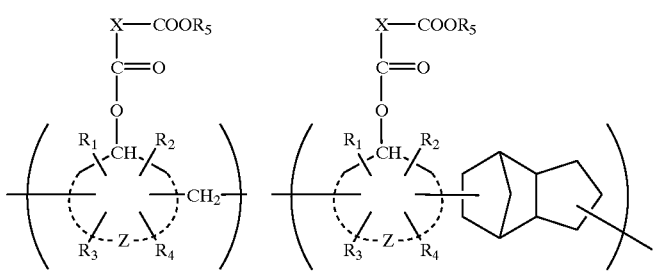

(wherein $R_1$ to $R_4$ each independently represents a hydrogen atom, a hydroxyl group, a carboxyl group, an alkyl group, an alkoxy group, a substituted alkyl group, a substituted alkoxy group, or a cycloalkyl group, provided that either $R_1$ and $R_3$ or $R_2$ and $R_4$ may be bonded to each other to form a ring;

X represents a bivalent organic group having 2 to 20 carbon atoms;

$R_5$ represents a hydrogen atom, an alkyl group, a substituted alkyl group, a cycloalkyl group, a substituted cycloalkyl group, or such a group that the —COOR$_5$ functions as a group which decomposes by the action of an acid; and Z represents a group of atoms which forms a cyclohexane or decalin ring in cooperation with the carbon atom).

(6) The positive photosensitive resin composition as described in (5) above wherein the polymer (B) has groups which decompose by the action of an acid.

(7) The positive photosensitive resin composition as described in (5) or (6) above which contains a low-molecular, acid-decomposable, dissolution inhibitive compound having a molecular weight of 2,000 or lower which has one or more groups decomposable by the action of an acid and comes to have enhanced alkali solubility by the action of an acid.

(8) The positive photosensitive resin composition as described in any one of (5) to (7) above wherein the actinic rays are far ultraviolet rays having a wavelength of 220 nm or shorter.

The present inventors made intensive investigations on constituent materials for chemical amplification type positive resist compositions. As a result, it has been found that the above object is accomplished by using a combination of a polymer containing a specific alicyclic hydrocarbon skeleton structure, a photo-acid generator, a nitrogen-containing basic compound, and at least one of a fluorine type surfactant and a silicon type surfactant. The present invention still further includes the following constitutions.

(9) A positive photosensitive resin composition comprising:

(A) a compound which generates an acid upon irradiation with actinic rays, (B) a polymer having a partial structure represented by the following general formula (Ic), (C) a nitrogen-containing basic compound, and (D) at least one of a fluorine type surfactant and a silicone type surfactant:

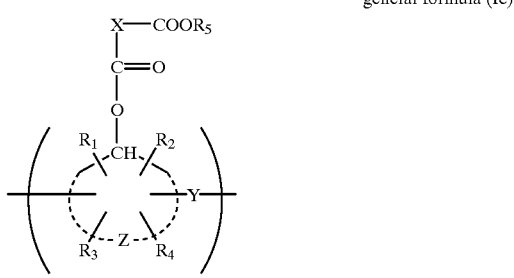

general formula (Ib)

general formula (Ic)

(wherein $R_1$ to $R_4$ each independently represents a hydrogen atom, a hydroxyl group, a carboxyl group, an alkyl group, an alkoxy group, a substituted alkyl group, a substituted alkoxy group, or a cycloalkyl group, provided that either $R_1$ and $R_3$ or $R_2$ and $R_4$ may be bonded to each other to form a ring;

X represents a bivalent organic group having 2 to 20 carbon atoms;

$R_5$ represents a hydrogen atom, an alkyl group, a substituted alkyl group, a cycloalkyl group, a substituted cycloalkyl group, or such a group that the —COOR$_5$ functions as a group which decomposes by the action of an acid;

Z represents a group of atoms which forms a cyclohexane or decalin ring in cooperation with the carbon atom; and Y represents

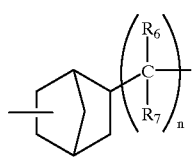

or

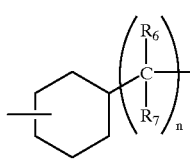

wherein $R_6$ and $R_7$ each independently represents a hydrogen atom or a methyl group and n represents 1 or 2).

(10) The positive photosensitive resin composition as described in (9) above wherein the polymer (B) has groups which decompose by the action of an acid.

(11) The positive photosensitive resin composition as described in (9) or (10) above which contains a low-molecule, acid-decomposable, dissolution inhibitive compound having a molecular weight of 2,000 or lower which has one or more groups decomposable by the action of an acid and comes to have enhanced alkali solubility by the action of an acid.

(12) The positive photosensitive resin composition as described in any one of (9) to (11) above wherein the actinic rays are far ultraviolet rays having a wavelength of 220 nm or shorter.

The present inventors made intensive investigations on constituent materials for chemical amplification type positive resist compositions. As a result, it has been found that the above object is accomplished by using a combination of a polymer containing a specific alicyclic hydrocarbon skeleton structure, a photo-acid generator, a nitrogen-containing basic compound, and at least one of a fluorine type surfactant and a silicone type surfactant. The present invention furthermore includes the following constitutions.

(13) A positive photosensitive resin composition comprising:

(A) a compound which generates an acid upon irradiation with actinic rays, (B) a polymer having a partial structure represented by the following general formula (Id), (C) a nitrogen-containing basic compound, and (D) at least one of a fluorine type surfactant and a silicone type surfactant:

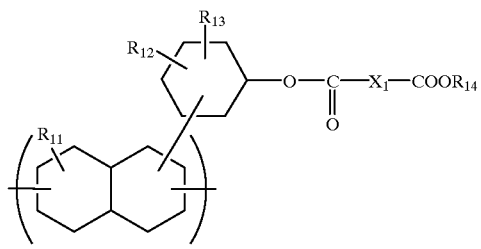

general formula (Id)

(wherein $R_{11}$ represents a methyl group or an ethyl group; $R_{12}$ and $R_{13}$ each independently represents a hydroxyl group, a carboxyl group, an alkyl group, an alkoxy group, a substituted alkyl group, a substituted alkoxy group, or a cycloalkyl group, provided that $R_{12}$ and $R_{13}$ may be bonded to each other to form a ring; $X_1$ represents a bivalent organic group having 2 to 20 carbon atoms; and $R_{14}$ represents a hydrogen atom, an alkyl group, a substituted alkyl group, a cycloalkyl group, a substituted cycloalkyl group, or such a group that the —$COOR_{14}$ functions as a group which decomposes by the action of an acid).

(14) The positive photosensitive resin composition as described in (13) above wherein the polymer (B) has groups which decompose by the action of an acid.

(15) The positive photosensitive resin composition as described in (13) or (14) above which contains a low-molecular, acid-decomposable, dissolution inhibitive compound having a molecular weight of 2,000 or lower which has one or more groups decomposable by the action of an acid and comes to have enhanced alkali solubility by the action of an acid.

(16) The positive photosensitive resin composition as described in any one of (13) to (15) above wherein the actinic rays are far ultraviolet rays having a wavelength or 220 nm or shorter.

DETAILED DESCRIPTION OF THE INVENTION

The compounds for use in the present invention will be explained below in detail.

First, the polymer (B) having a structure represented by formula (Ia) is explained.

Examples of the alkyl group represented by $R_1$ to $R_4$ in general formula (Ia) include linear or branched alkyl groups having 1 to 10 carbon atoms, which may be substituted. Specific examples thereof include methyl, ethyl, propyl, isopropyl, n-butyl, t-butyl, hydroxymethyl, hydroxyethyl, norbornylmethyl, and adamantylmethyl. Examples of the cycloalkyl group represented by $R_1$ to $R_4$ include cyclopentyl and cyclohexyl.

Examples of the alkoxy group represented by $R_1$ to $R_4$ include alkoxy groups having 1 to 10 carbon atoms and may have one or more substituents. Specific examples thereof include methoxy, ethoxy, n-butoxy, t-butoxy, propoxy, and isopropoxy.

Examples of the substituents for the groups described above include halogen atoms, cyano, and nitro.

Examples of the alkyl group and substituted alkyl group represented by $R_5$ are the same as those enumerated above with regard to $R_1$ to $R_4$. Examples of the cycloalkyl group represented by $R_5$ include cycloalkyl groups having 4 to 20 carbon atoms, such as cyclopentyl, cyclohexyl, adamantyl, norbornyl, tricyclodecanyl, tetracyclododecanyl, and tricyclopentyl. Examples of the substituents for these cycloalkyl groups include hydroxyl, halogen atoms, carboxyl, and alkyl or alkoxy groups having 1 to 4 carbon atoms.

Examples of the ring formed by $R_1$ to $R_3$ bonded to each other or by $R_2$ and $R_4$ bonded to each other include the rings in which the bonded $R_1$ and $R_3$ or the bonded $R_2$ and $R_4$ constitute any of the following groups.

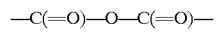

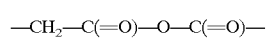

When —$COOR_5$ represents a group which decomposes by the action of an acid, examples of $R_5$ include hydrocarbon groups having 2 to 20 carbon atoms (e.g., t-butyl, norbornyl, and cyclodecanyl), tetrahydrofuranyl, tetrahydropyranyl, alkoxyethyl groups such as ethoxyethyl and isopropylethyl, lactone groups, and cyclohexyloxyethyl.

Examples of the bivalent organic group having 2 to 20 carbon atoms represented by X include alkylene groups having 2 to 20 carbon atoms, such as ethylene and propylene, cycloalkylene groups having 4 to 20 carbon atoms, such as cyclobutylene and cyclohexylene, arylene groups having 6 to 20 carbon atoms, such as phenylene, and bivalent cycloolefin groups which may have a crosslink.

The partial structure represented by general formula (I) may be contained in the main chain of the polymer or in a side chain thereof. In the present invention, however, the partial structure is preferably contained in the main chain of the polymer.

Examples of the polymer having repeating units each comprising the partial structure represented by general formula (Ia) include the polymers represented by the following formulae (a-1) to (a-24).

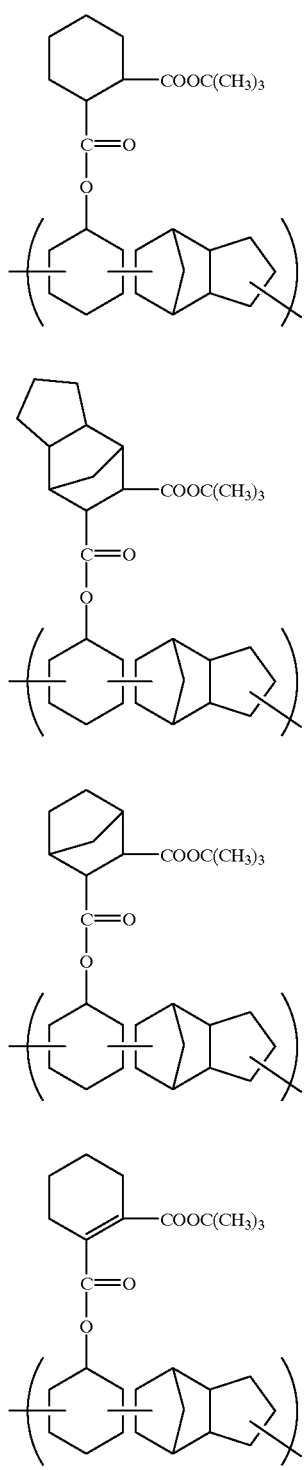
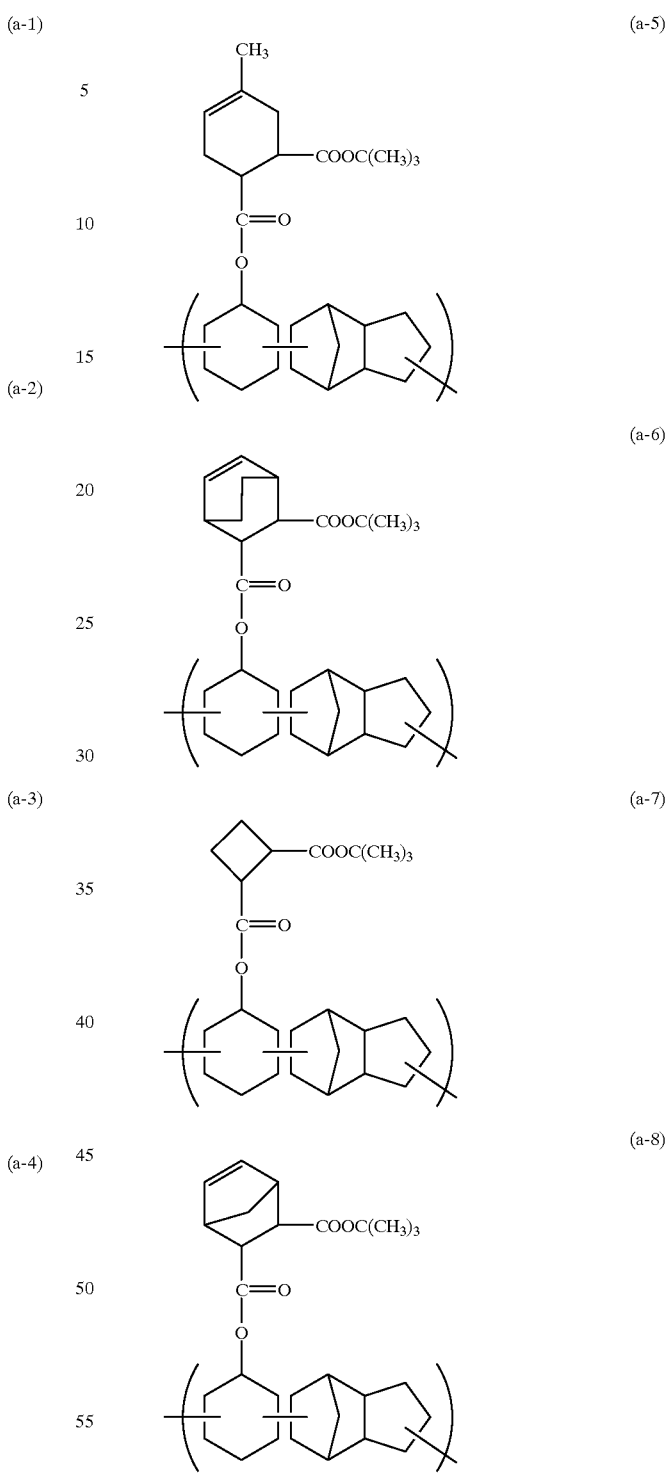

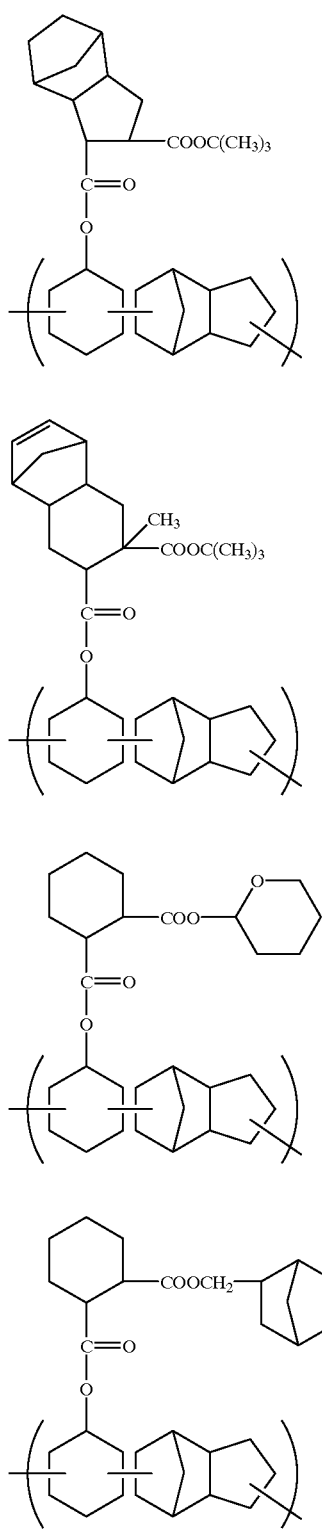
(a-9)
(a-10)
(a-11)
(a-12)
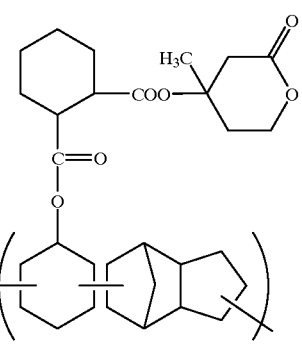
(a-13)
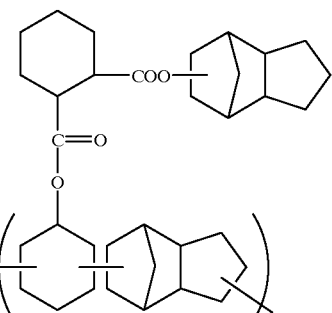
(a-14)
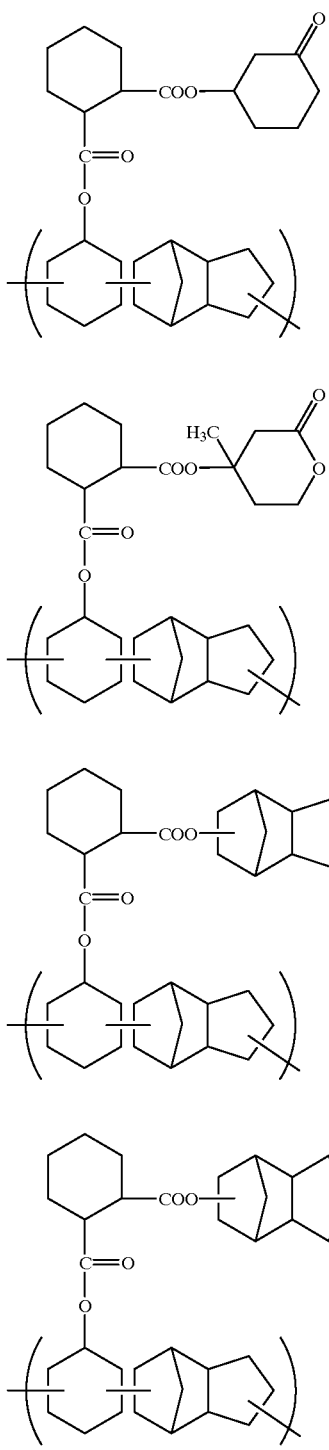
(a-15)
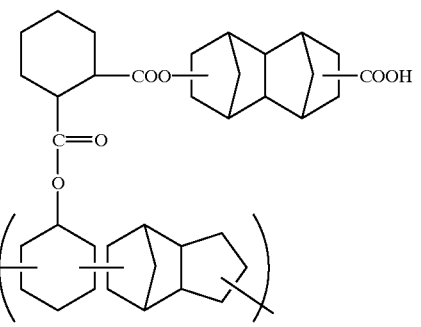
(a-16)

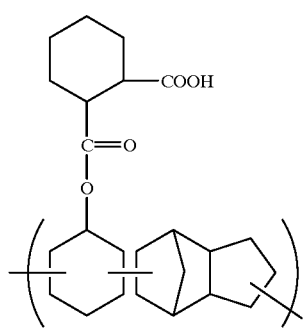
(a-17)
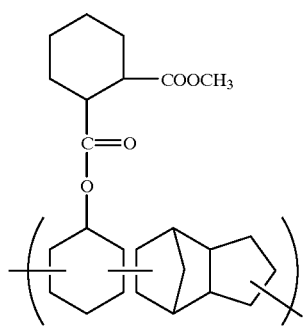
(a-18)
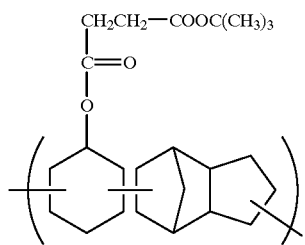
(a-19)
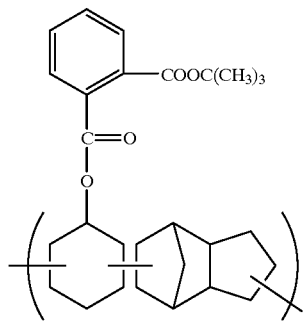
(a-20)
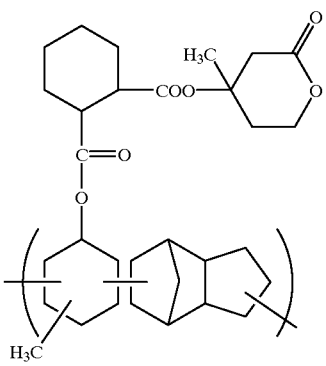
(a-21)
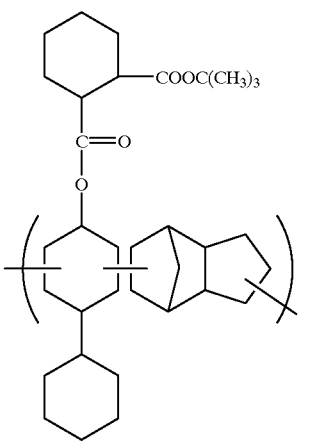
(a-22)
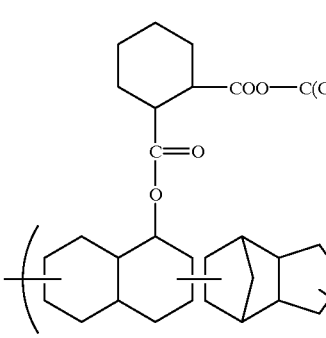
(a-23)
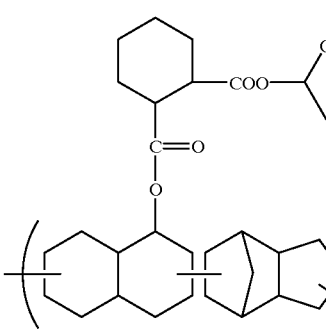
(a-24)

In one example of processes for synthesizing the above polymers, dicyclopentadiene is first polymerized with a phenol compound to synthesize a polymer having structural units represented by the following general formula (II), and this polymer is hydrogenated to obtain a polymer represented by the following general formula (III). The polymer represented by general formula (III) is esterified with a carboxylic anhydride represented by the following general formula (IV) to obtain a polymer represented by the following general formula (V).

The polymer represented by general formula (V) is further esterified with a given monomer according to need to thereby obtain the exemplified polymer represented by any of (a-1) to (a-24).

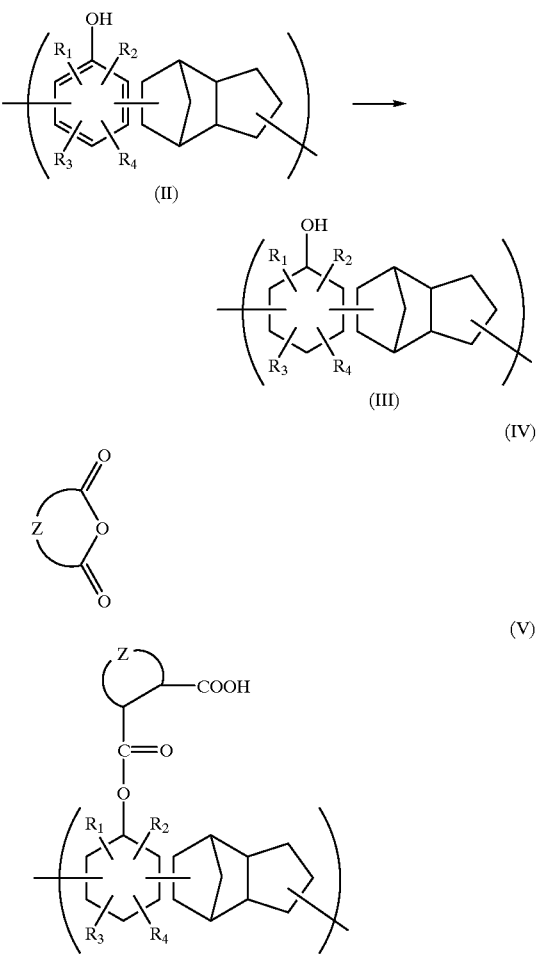

(In the above formulae, Z represents a bivalent organic group, and $R_1$ to $R_4$ have the same meaning as the $R_1$ to $R_4$ in general formula (Ia).)

The above synthesis process will be explained below in more detail.

The polymer represented by general formula (II) is synthesized by the method described, e.g., in JP-A-60-104830, JP-A-62-4720, JP-A-62-104830, JP-A-63-99224, JP-A-4-300916, JP-A-4-164919, JP-A-168122, JP-A-4-170423, JP-A-4-170424, JP-A-4-222819, and JP-A-4-339820, in which dicyclopentadiene is reacted with a phenol compound in a molten state or in an appropriate solvent. Examples of the solvent include benzene, toluene, and xylene. This polymerization may be conducted by a method in which a Lewis acid is added dropwise to a mixture of dicyclopentadiene and a phenol compound, or by a method in which dicyclopentadiene is added dropwise to a mixture of a phenol compound and a Lewis acid. The dropwise addition may be conducted over a period of from several minutes to several hours. After the addition, the reaction mixture may be further reacted for several hours. The reaction temperature for this polymerization is generally from 20 to 180° C., preferably from 60 to 120° C.

For hydrogenating the polymer represented by general formula (II) to obtain the polymer represented by general formula (III), known methods can be used. For example, the polymer represented by general formula (II) is dissolved in a solvent and this solution is brought into contact with hydrogen in the presence of a metal catalyst. The solvent is preferably one in which the polymer represented by general formula (II) readily dissolves and which is table to the hydrogenation and can be easily removed after the hydrogenation. Preferred examples thereof include lower alcohols such as methanol, ethanol, propanol, and butanol, lower ketones such as acetone, methyl ethyl ketone, and methyl isobutyl ketone, and cyclic ethers such as tetrahydrofuran and dioxane. Also usable are phenols such as cresols. Especially preferred of these solvents are lower alcohols. Preferred examples of the metal catalyst include nickel, cobalt, palladium, platinum, and rhodium. Such catalyst metals may be used either as they are or after having been fixed to a metal oxide support. In general, nickel and cobalt each is used alone in a Raney form or after having been fixed to a porous support such as silica, alumina, carbon, or diatomaceous earth.

Noble metals are generally used in the form of an oxide or after having been fixed to a support. Although the use amount of the catalyst varies depending on the kind of the catalyst, an appropriate range thereof is generally as follows. The hydrogenation may be carried out either by a batch process in an autoclave or the like or by a continuous process in which the reaction mixture is passed through a fixed bed. In the case of a batch process, an appropriate range of the catalyst amount is about from 0.01 to 10% by weight in terms of metal amount based on the polymer to be treated. In the case of a continuous flow process, an appropriate range of the catalyst amount is such that the WHSV of the polymer based on the catalyst is about from 0.1 to 10 kg/kg·hr.

In the case of a continuous flow process, a catalyst fixed to a support is generally used. The temperature for the hydrogenation is generally from 50 to 300° C., preferably from 150 to 250° C. The pressure of hydrogen is generally from 10 to 200 kg/cm$^2$, preferably from 50 to 100 kg/cm$^2$, from the standpoints of the reaction temperature, withstand pressure of the apparatus, etc. Any desired treatment period can be selected according to the conditions for the treatment, e.g., the kind and amount of the catalyst used and the treatment temperature, and to the properties of the polymer to be treated, etc.

In the present invention, the degree of hydrogenation of the aromatic nuclei is preferably 60% or higher, more preferably 70% or higher, most preferably 80% or higher. Degrees of nucleus hydrogenation lower than 60% are undesirable in that the results are enhanced optical absorption at 193 nm and hence impaired resist profiles.

The method for obtaining the polymer represented by general formula (V) is explained next. The polymer represented by general formula (V) is obtained by esterifying the polymer represented by general formula (III) with a carboxylic anhydride represented by general formula (IV).

Examples of the carboxylic anhydride used for the esterification include maleic anhydride, succinic anhydride, itaconic anhydride, phthalic anhydride, citraconic anhydride, α-methylglutaconic anhydride, tetrahydrophthalic anhydride, hexahydrophthalic anhydride, chloromaleic anhydride, d-phenylmaleic anhydride, pyromellitic anhydride, Himic anhydride, 3,6-endomethylenephthalic anhydride, terpene/maleic anhydride adducts, α-terpinene/maleic anhydride adducts, 4,5-cyclohexenedicarboxylic anhydride, 1-methyl-4,5-cyclohexenedicarboyxlic anhydride, 3,6-methylene-1,2,3,6-tetrahydro-cis-phthalic anhydride, (4-carboxy-4-cyclohexenyl)acetic anhydride, 4-methyl-4,5-cyclohexenedicarboxylic anhydride, (4-carboxy-5-cyclohexenyl)acetic anhydride, 3,6-methylene-1,2,3,6-tetrahydro-cis-phthalic anhydride, 6-(5-carboxybicyclo[2.2.1]hept-2-enyl)acetic anhydride, 3,6-methano-1-methyl-1,2,3,6-tetrahydro-cis-phthalic anhydride, 2-oxa-1,4-dioxo-5,8-methano-1,2,3,4,4a,5,8,8a-octahydronaphthalene-5,8-methano-1,2,3,4,4a,5,8,8a-octahydronaphthalene-1,2-dicarboxylic anhydride, 5,8-methano-1-methyl-1,2,3,4,4a,5,8,8a-octahydronaphthalene-2,3-dicarboxylic anhydride, 1,4,5,8-dimethano-1,2,3,4,4a,5,8,8a-octahydronaphthalene-2,3-dicarboxylic anhydride, 2-oxa-1,3-dioxo-1,2,3,4,4a,5,8,8a,9,9a,10,10a-dodecahydroanthracene, 4-(5-bicyclo[2.2.1]-hept-2-enyl)phthalic anhydride, phenolphthalein, 4-(2,5-dioxotetrahydrofuran-3-yl)tetralin-1,2-dicarboxylic anhydride, 5-(2,5-dioxotetrahydrofuranyl)-3-methyl-3-cyclohexene-1,2-dicarboxylic anhydride, 4-methylcyclohexane-1,2-dicarboxylic anhydride, methylcyclohexene-1,2-dicarboxylic anhydride, and endo-bicyclo[2.2.2]oct-5-ene-2,3-dicarboxylic anhydride.

Such carboxylic anhydrides can be used alone or in combination of two or more thereof.

The esterification reaction can be conducted, for example, by the method described in R. P. Hanzilik, Org. Synth., VI, 560 (1988) or J. Cason, Org. Synth., III, 169 (1955), whereby the target polymer is easily obtained. Specifically, the polymer represented by general formula (III) is dissolved in a solvent together with a carboxylic anhydride represented by general formula (IV) and the reactants are reacted with each other in the presence of a catalyst at a temperature of from 5 to 150° C. to obtain the target polymer. Examples of the solvent used here include benzene, toluene, xylene, DMF, and THF. The catalyst may be a basic catalyst, example of which include pyridine, sodium acetate, 4-dimethylaminopyridine, and triethylamine.

In the esterification reaction, the polymer represented by general formula (III) and the carboxylic anhydride represented by general formula (IV) are charged preferably in such molar concentrations that the amount of the carboxylic anhydride represented by general formula (IV) is from 0.5 to 2.0 mol per 1.0 mol of the polymer represented by general formula (III). Charged amounts of the carboxylic anhydride smaller than 0.5 mol per mol of the polymer are undesirable in that the resultant polymer represented by general formula (V) has insufficient alkali solubility to give a resist which as reduced sensitivity or reduced resolution. On the other hand, if the charged amount of the carboxylic anhydride exceeds 2.0 mol per mol of the polymer, the acid anhydride forms a diester through alcoholysis. As a result, the polymer represented by general formula (V) tends to have insufficient alkali solubility and give a resist having reduced sensitivity. It is therefore preferred to control the reaction so that the acid anhydride forms a half ester through alcoholysis.

This positive photoresist composition included in the present invention may contain a polymer represented by general formula (V) (a polymer having a partial structure represented by general formula (Ia) but containing no acid-decomposable groups), an acid-decomposable dissolution inhibitor, and a photo-acid generator. However, it is preferred to incorporate acid-decomposable groups into the polymer represented by general formula (V). Namely, the polymer having a partial structure represented by general formula (Ia) preferably contains acid-decomposable groups.

Acid-decomposable groups can be incorporated into the polymer represented by general formula (V) by protecting carboxyl groups of the polymer through an esterification reaction. Examples of this esterification reaction include a method in which the polymer represented by general formula (V) is esterified with a tertiary alcohol with the aid of 4-dimethylaminopyridine (DMAP) or the like (see G. Hoefle, W. Steglich, and Vorbrueggen, Angew. Chem. Int. Ed. Engle., 17, 569 (1978)), a method in which trifluoroacetic anhydride is used (see R. C. Parish and L. M. Stock, J. Org. Chem., 30, 927 (1965)), and a method in which DCC (dicyclohexylcarbodiimide) is used (see B. Neises and W. Steglich, Org. Snyth., 63, 183 (1985)).

Furthermore, a method may be used which comprises converting carboxyl groups of the polymer represented by general formula (V) into a carbonyl chloride with $SOCl_2$ or the like and then reacting the carbonyl chloride with an alcohol or metal alkoxide to form an ester. It is also possible to use the DCC-DMAP method.

Secondly, the polymer (B) having a structure represented by formula (Ib) is explained below.

$R_1$ to $R_5$, X, and Z in general formula (Ib) have the same meanings as those in general formula (Ia).

The subtituents or groups represented by each of $R_1$ to $R_5$, X, and Z in general formula (Ib) may be the same or different.

The partial structure represented by general formula (Ib) may be contained in the main chain of the polymer or in a side chain thereof. In the present invention, however, the partial structure is preferably contained in the main chain of the polymer.

Examples of the polymer having repeated units each comprising a partial structure represented by general formula (Ib) include the following polymers (a–1b) to (a–13b).

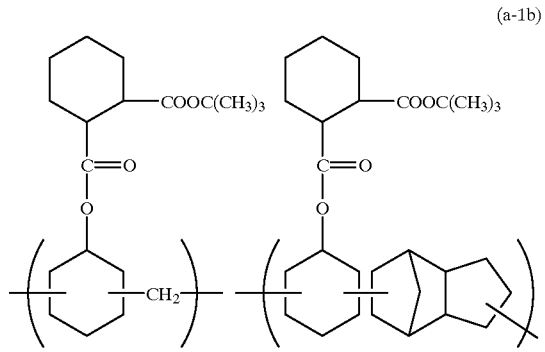

(a-1b)

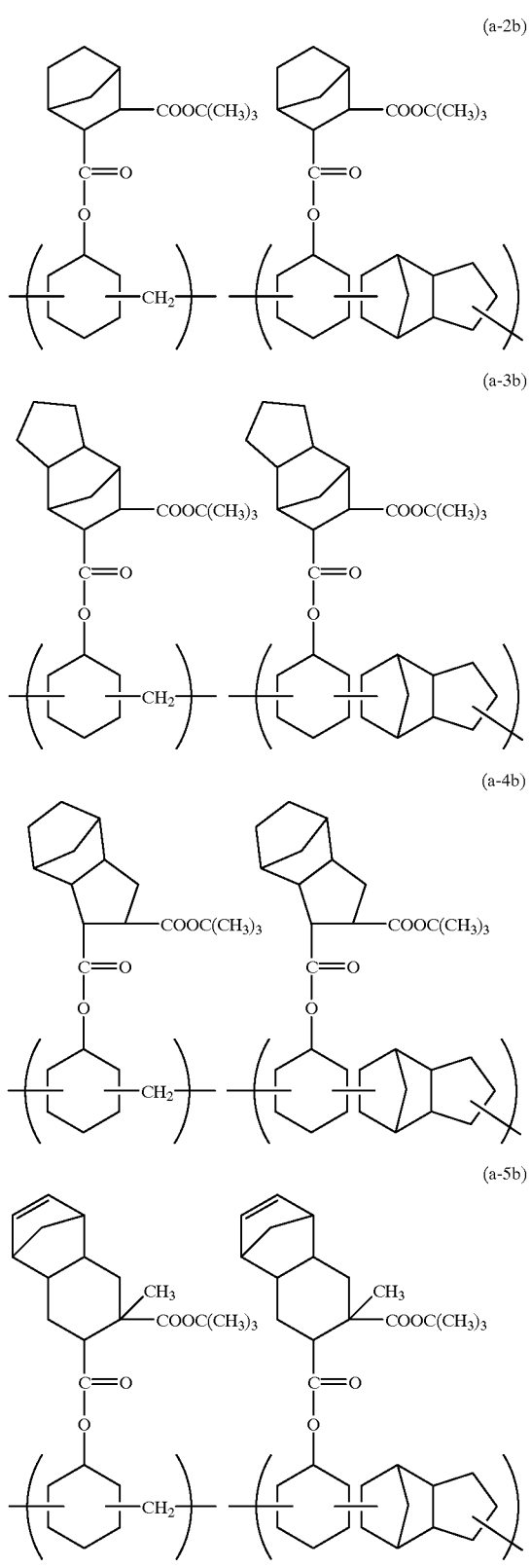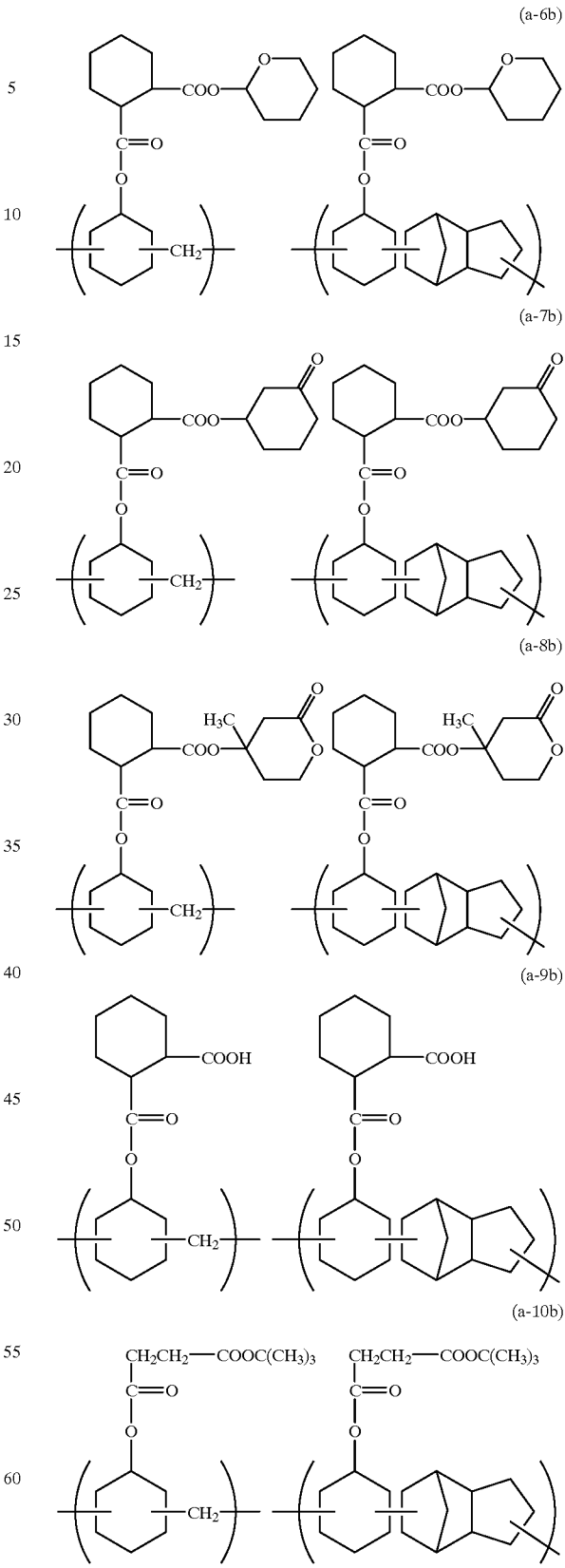

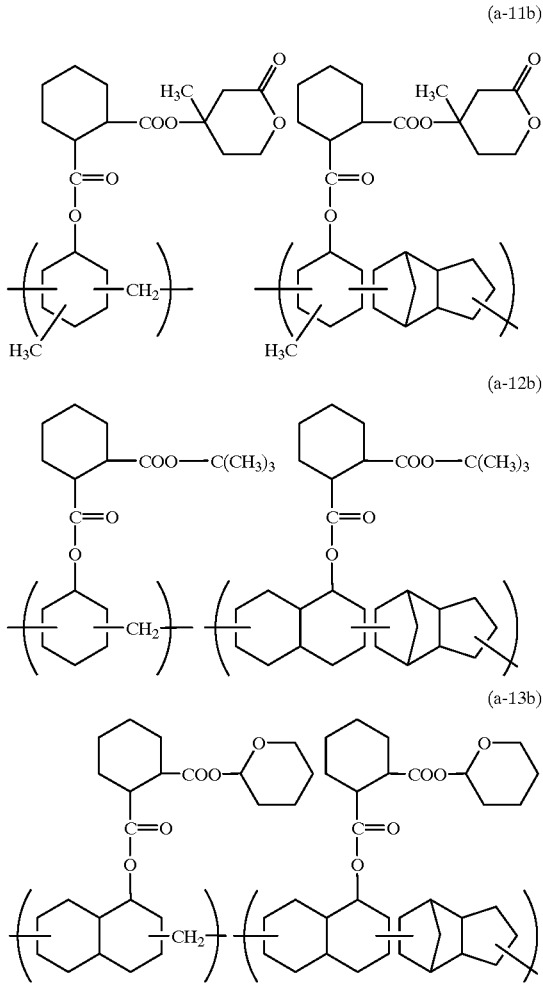

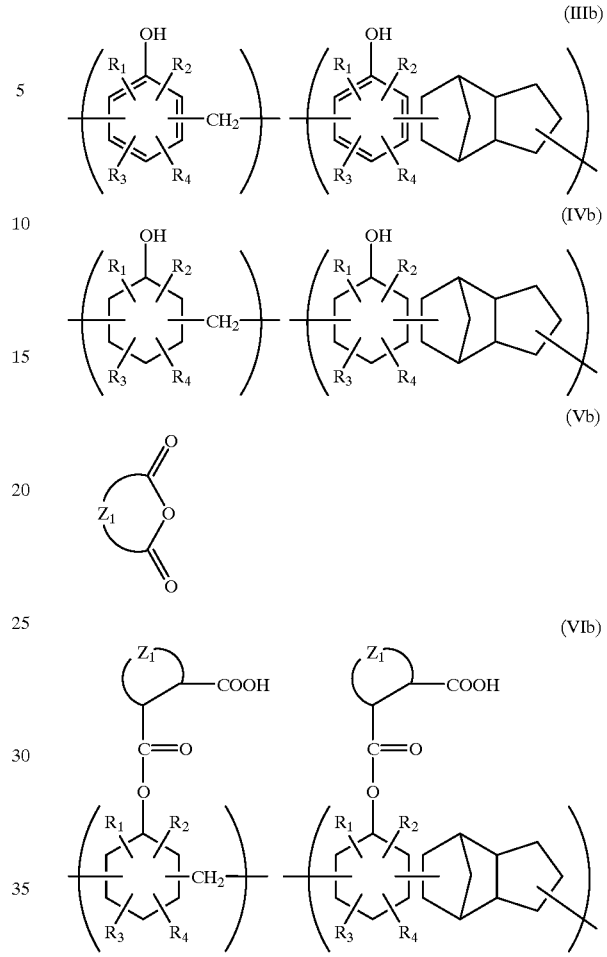

One example of processes for synthesizing these polymers (B) is a method described in JP-A-7-306532. In this method, dicyclopentadiene is first polymerized with a phenol compound to synthesize a polymer having structural units represented by the following general formula (IIb), and the remaining phenol compound is condensed with an aldehyde to obtain a polymer represented by the following general formula (IIIb). The polymer represented by general formula (IIIb) is hydrogenated to obtain a polymer represented by the following general formula (IVb). The polymer represented by general formula (IVb) is esterified with a carboxylic anhydride represented by general formula (Vb) to obtain a polymer represented by general formula (VIb).

The polymer represented by general formula (VIb) is further esterified with a given monomer according to need to thereby obtain the exemplified polymer represented by any of (a–1b) to (a–13b).

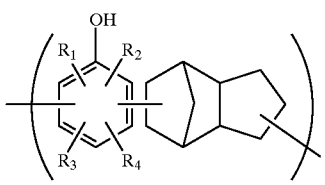

(IIb)

(In the above formulae, $Z_1$ represents a bivalent organic group, and $R_1$ to $R_4$ have the same meaning as the $R_1$ to $R_4$ in general formula (Ib).)

The above synthesis process will be explained below in more detail. The polymer represented by general formula (IIb) is synthesized by the method described, e.g., in JP-A-60-104830, JP-A-62-4720, JP-A-62-104830, JP-A-63-99224, JP-A-4-300916, JP-A-4-164919, JP-A-4-168122, JP-A-4-170423, JP-A-4-170424, JP-A-4-222819, and JP-A-4-339820, in which dicyclopentadiene is reacted with a phenol compound in a molten state or in an appropriate solvent. Examples of the solvent include benzene, toluene, and xylene. This polymerization may be conducted by a method in which a Lewis acid is added dropwise to a mixture of dicyclopentadiene and a phenol compound, or by a method in which dicyclopentadiene is added dropwise to a mixture of a phenol compound and a Lewis acid. The dropwise addition may be conducted over a period of from several minutes to several hours. After the addition, the reaction mixture may be further reacted for several hours. The reaction temperature for this polymerization is generally from 20 to 180° C., preferably from 60 to 120° C.

After the first-stage reaction described above, the synthesis of the polymer represented by general formula (IIIb), i.e., the condensation of the remaining phenol compound with an aldehyde as the second-stage reaction, can be conducted successively. These reactants are reacted in a molten state or in an appropriate solvent. A solvent may be freshly added for this reaction. Besides the solvents enumerated above, examples of this solvent include methanol, ethanol, acetone, methyl ethyl ketone, methyl isobutyl ketone, and tetrahydrofuran. A small amount of water may be added in this stage to decompose the Lewis acid. It is also possible to freshly add an acid catalyst such as a Lewis acid, hydrochloric acid, phosphoric acid, or oxalic acid.

The aldehyde can be paraformaldehyde, an aqueous solution of formaldehyde, or the like. When paraformaldehyde is used, a solution thereof in a solvent may be added dropwise or the aldehyde in the solid state may be added in two or more portions. When an aqueous formaldehyde solution is used, it may be added dropwise over a period of from several minutes to several hours. This reaction may be performed at a temperature in the same range as that for the first-stage reaction or at a different temperature.

Subsequently, the phenol compound remaining unreacted is removed from the reaction mixture by vacuum distillation, and the residue is diluted to a given concentration with a solvent. The resultant solution is washed with ion-exchanged water to mainly remove ions. Thereafter, the solvents used for the reaction and washing are removed by vacuum distillation, and the residue is cooled to obtain a solid. Thus, the modified phenolic resin can be obtained.

For hydrogenating the polymer represented by general formula (IIIb) to obtain the polymer represented by general formula (IVb), known methods can be used. For example, the polymer represented by general formula (IIIb) is dissolved in a solvent and this solution is brought into contact with hydrogen in the presence of a metal catalyst. The solvent is preferably one in which the polymer represented by general formula (IIIb) readily dissolves and which is stable to the hydrogenation and can be easily removed after the hydrogenation. Preferred examples thereof include lower alcohols such as methanol, ethanol, propanol, and butanol, lower ketones such as acetone, methyl ethyl ketone, and methyl isobutyl ketone, and cyclic ethers such as tetrahydrofuran and dioxane. Also usable are phenols such as cresols. Especially preferred of these solvents are lower alcohols.

Preferred examples of the metal catalyst include nickel, cobalt, palladium, platinum, and rhodium. Such catalyst metals may be used either as they are or after having been fixed to a metal oxide support. In general, nickel and cobalt each is used alone in a Raney form or after having been fixed to a porous support such as silica, alumina, carbon, or diatomaceous earth.

Noble metals are generally used in the form of an oxide or after having been fixed to a support. Although the use amount of the catalyst varies depending on the kind of the catalyst, an appropriate range thereof is generally as follows. The hydrogenation may be carried out either by a batch process in an autoclave or the like or by a continuous process in which the reaction mixture is passed through a fixed bed. In the case of a batch process, an appropriate range of the catalyst amount is about from 0.01 to 10% by weight in terms of metal amount based on the polymer to be treated. In the case of a continuous flow process, an appropriate range of the catalyst amount is such that the WHSV of the polymer based on the catalyst is about from 0.1 to 10 kg/kg·hr. In the case of a continuous flow process, a catalyst fixed to a support is generally used. The temperature for the hydrogenation is generally from 50 to 300° C., preferably from 150 to 250° C. The presence of hydrogen is generally from 10 to 200 kg/cm$^2$, preferably from 50 to 100 kg/cm$^2$, from the standpoints of the reaction temperature, withstand pressure of the apparatus, etc. Any desired treatment period can be selected according to the conditions for the treatment, e.g., the kind and amount of the catalyst used and the treatment temperature, and to the properties of the polymer to be treated, etc.

In the present invention, the degree of hydrogenation of the aromatic nuclei is preferably 60% or higher, more preferably 70% or higher, most preferably 80% or higher. Degrees of nucleus hydrogenation lower than 60% are undesirable in that the results are enhanced optical absorption at 193 nm and hence impaired resist profiles.

The method for obtaining the polymer represented by general formula (VIb) is explained next. The polymer represented by general formula (VIb) is obtained by esterifying the polymer represented by general formula (IVb) with a carboxylic anhydride represented by general formula (Vb).

Examples of the carboxylic anhydride used for the above esterification are the same as those enumerated hereinabove.

The esterification reaction can be conducted, for example, by the method described in R. P. Hanzilik, Org. Synth., VI, 560 (1988) or J. Cason, Org. Synth., II, 169 (1955), whereby the target polymer is easily obtained. Specifically, the polymer represented by general formula (IVb) is dissolved in a solvent together with a carboxylic anhydride represented by general formula (Vb) and the reactants are reacted with each other in the presence of a catalyst at a temperature of from 5 to 150° C. to obtain the target polymer. Examples of the solvent used here include benzene, toluene, xylene, DMF, and THF. The catalyst may be a basic catalyst, examples of which include pyridine, sodium acetate, 4-dimethylaminopyridine, and triethylamine.

In the esterification reaction, the polymer represented by general formula (IVb) and the carboxylic anhydride represented by general formula (Vb) are charged preferably in such molar concentrations that the amount of the carboxylic anhydride represented by general formula (Vb) is from 0.5 to 2.0 mol per 1.0 mol of the polymer represented by general formula (IVb). Charged amounts of the carboxylic anhydride smaller than 0.5 mol per mol of the polymer are undesirable in that the resultant polymer represented by general formula (VIb) has insufficient alkali solubility to give a resist which has reduced sensitivity or reduced resolution. On the other hand, if the charged amount of the carboxylic anhydride exceeds 2.0 mol per mol of the polymer, the acid anhydride forms a diester through alcoholysis. As a result, the polymer represented by general formula (VI) has insufficient alkali solubility and gives a resist having reduced sensitivity. It is therefore preferred to control the reaction so that the acid anhydride forms a half ester through alcoholysis.

This positive photoresist composition included in the present invention may contain a polymer represented by general formula (VIb) (a polymer (B) containing no acid-decomposable groups), an acid-decomposable dissolution inhibitor, and a photo-acid generator.

It is, however, preferred to incorporate acid-decomposable groups into the polymer represented by general formula (VIb) (the polymer having a partial structure represented by general formula (Ib)).

Acid-decomposable groups can be incorporated into the polymer represented by general formula (VIb) by protecting carboxyl groups of the polymer through an esterification reaction. Examples of this esterification reaction include the same methods as those described hereinabove.

Thirdly, the polymer (B) having a structure represented by formula (Ic) is explained below.

$R_1$ to $R_5$, X, and Z in general formula (Ic) have the same meanings as those in general formula (Ia).

The partial structure represented by general formula (Ic) may be contained in the main chain of the polymer or in a side chain thereof. In the present invention, however, the partial structure is preferably contained in the main chain of the polymer.
Examples of the polymer having a partial structure represented by general formula (Ic) include the polymers represented by the following (a–1c) to (a–24c).
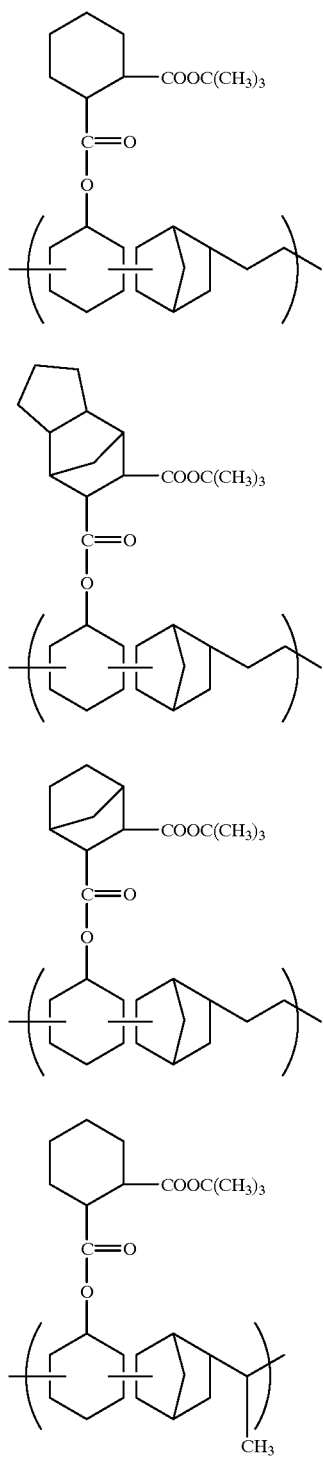
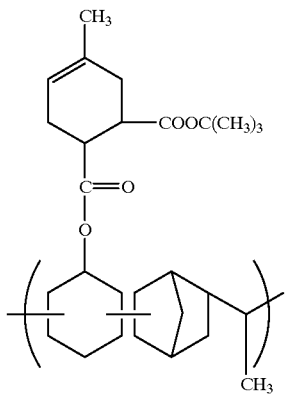
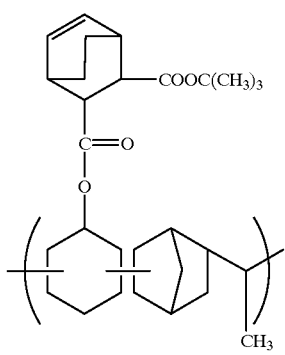
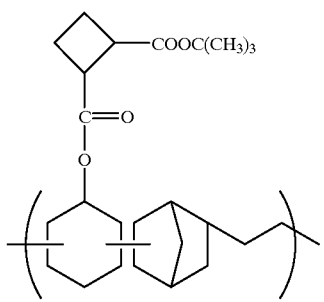
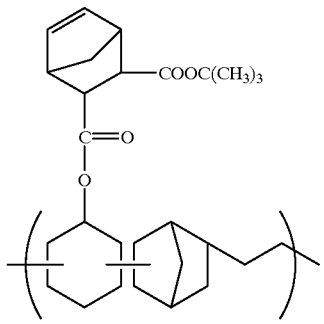

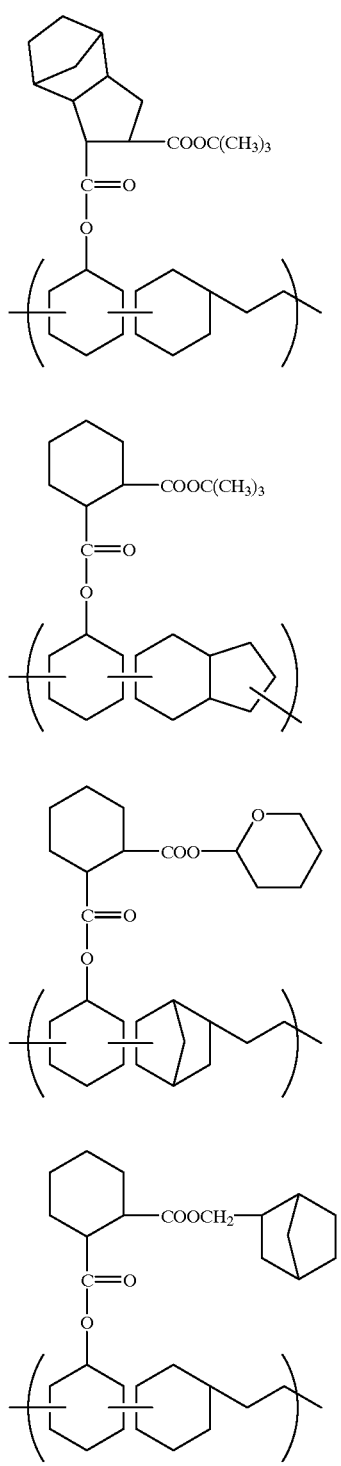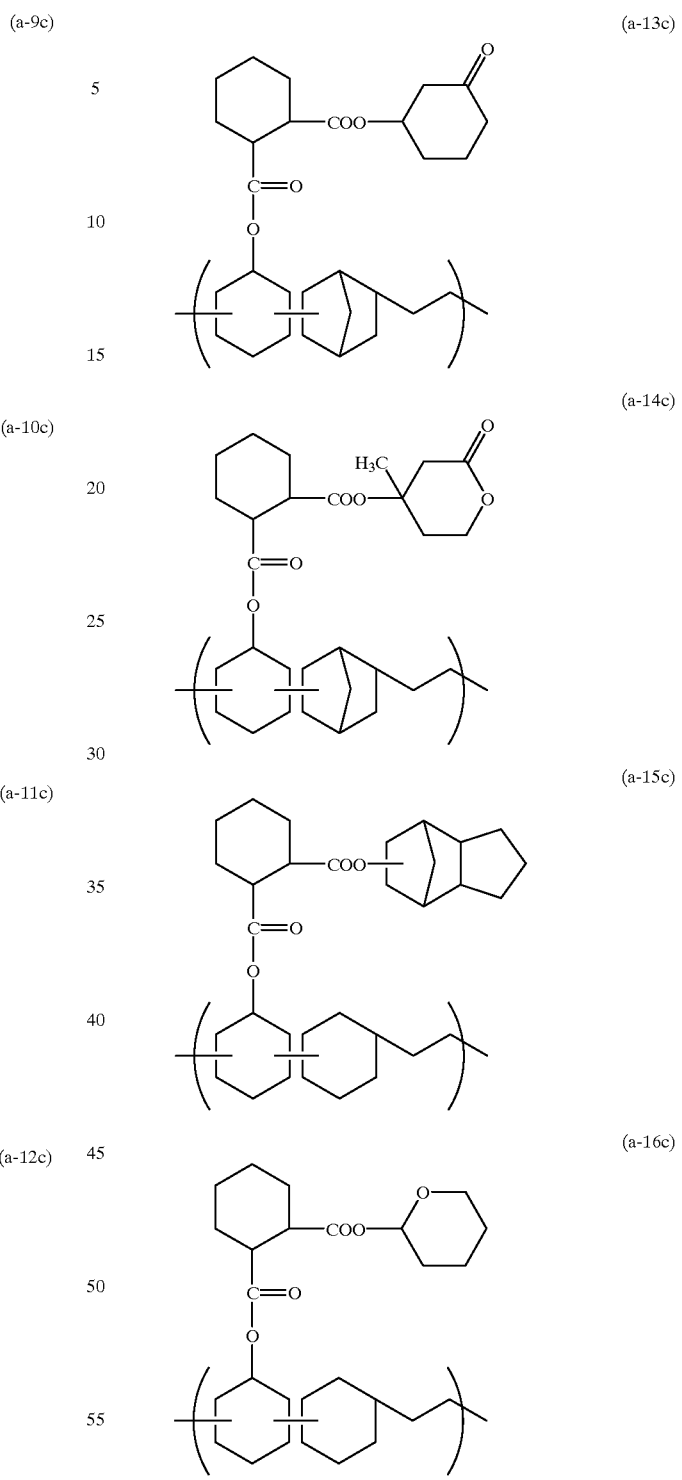

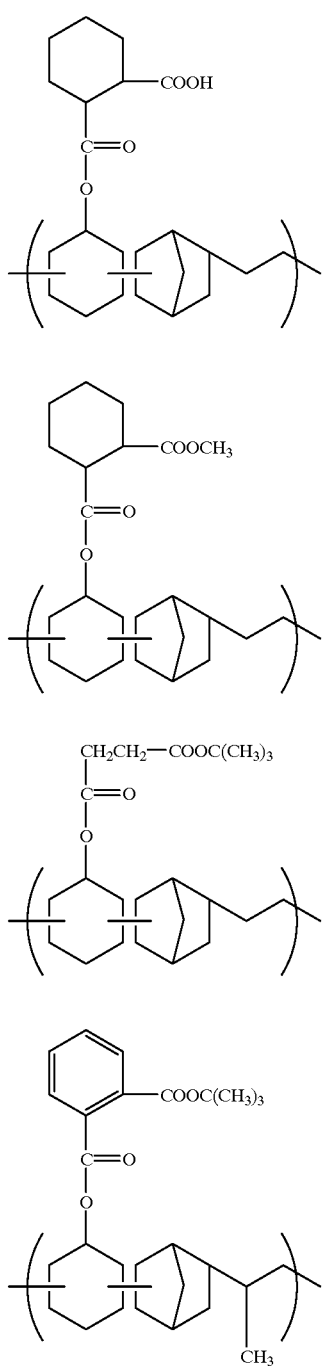
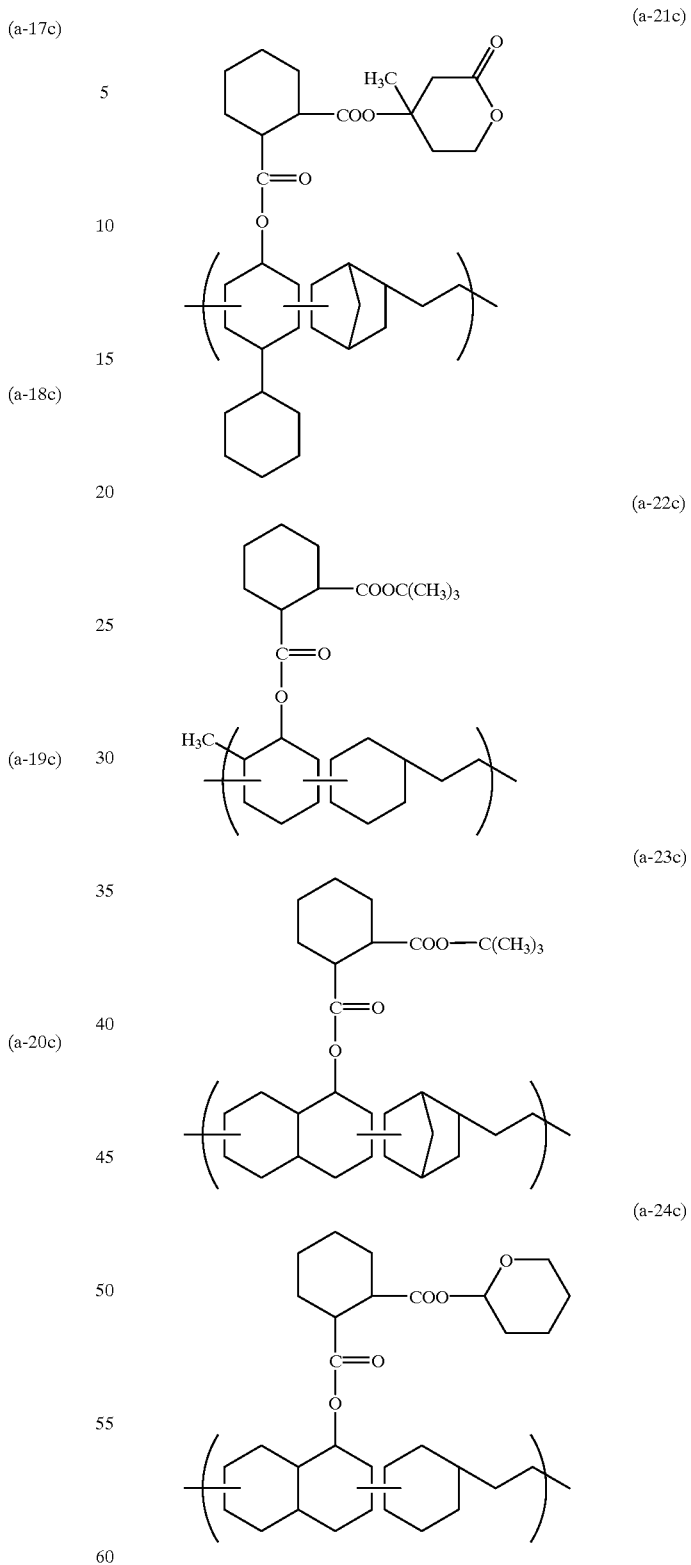

One example of processes for synthesizing a polymer having a partial structure represented by general formula (Ic) is a method described in JP-A-5-163328. In this method, 4-vinylcyclohexene and/or 5-vinylnorbornene is first polymerized with a phenol compound to synthesize a polymer having structural units represented by the following general formula (IIc), and this polymer is hydrogenated to obtain a polymer represented by the following general formula (IIIc). The polymer represented by general formula (IIIc) is esterified with a carboxylic anhydride represented by the following general formula (IVc) to obtain a polymer represented by the following general formula (Vc).

The polymer represented by general formula (Vc) is further esterified with a given monomer according to need to thereby obtain the exemplified polymer represented by any of (a–1c) to (a–24c).

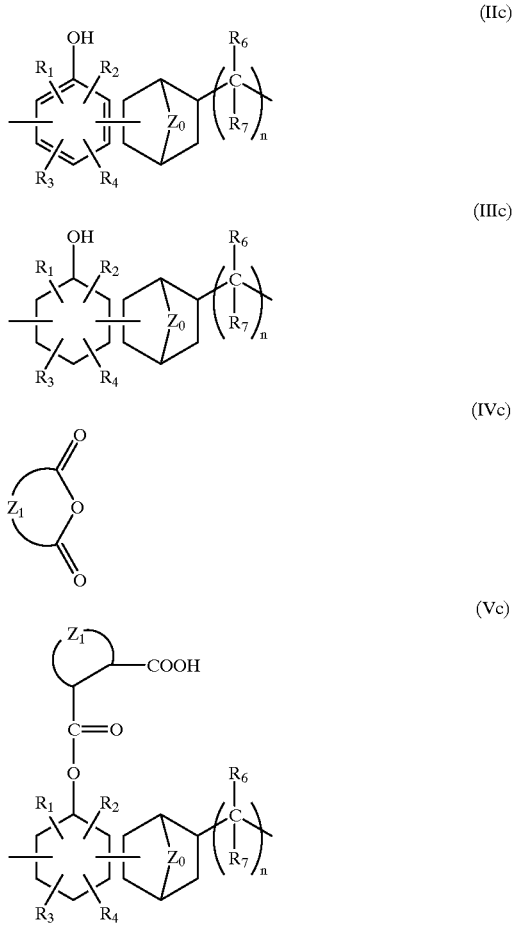

(In the above formulae, $Z_0$ represents —$(CH_2)_m$—; $R_6$ and $R_7$ each represents a hydrogen atom or a methyl group; m represents 0 or 1; n represents 1 or 2; $Z_1$ represents a bivalent organic group; and $R_1$ to $R_4$ have the same meaning as in general formula (Ic)).

The above synthesis process is explained in more detail. The polymer represented by general formula (IIc) is easily obtained by reacting 4-vinylhexene and/or 5-vinylnorbornene with a phenol compound in the presence of an acid catalyst. Examples of the phenol compound include phenol, o-cresol, m-cresol, p-cresol, t-butylphenol, cyclohexylphenol, p-cumylphenol, xylenols, and naphthols.

In the reaction of 4-vinylcyclohexene and/or 5-vinylnorbornene with a phenol compound, the reactants are charged in such a proportion that the charged amount of the phenol compound is preferably from 0.8 to 12 mole equivalents, more preferably from 2 to 10 mole equivalents, to the 4-vinylcyclohexene and/or 5-vinylnorbornene. Charged amounts of the phenol compound smaller than 0.8 mole equivalents are undesirable in that a polymer having a desired molecular weight is difficult to obtain. Charged amounts thereof exceeding 12 mole equivalents are undesirable in that removal of the phenol compound remaining unreacted necessitates much labor.

Preferred examples of the acid catalyst used for the reaction of 4-vinylcyclohexene and/or 5-vinylnorbornene with a phenol compound include boron trifluoride; complexes of boron trifluoride, such as ether complexes, water complex, amine complexes, phenol complex, and alcohol complexes of boron trifluoride; aluminum compounds such as aluminum trichloride and diethylaluminum monochloride; iron chloride; titanium tetrachloride; sulfuric acid; hydrogen fluoride; and trifluoromethanesulfonic acid. Preferred especially from the standpoints of catalytic activity and easiness of catalyst removal are boron trifluoride, boron trifluoride/ether complexes, boron trifluoride/phenol complex, boron trifluoride/water complex, boron trifluoride/alcohol complexes, and boron trifluoride/amine complexes. Most preferred of these are boron fluoride and boron trifluoride/phenol complex. Such acid catalysts are used in different amounts. For example, boron trifluoride/phenol complex is used in an amount of preferably from 0.1 to 20 parts by weight, more preferably from 0.5 to 10 parts by weight, per 100 parts by weight of the 4-vinylcyclohexene and/or 5-vinylnorbornene.

The above reaction can be carried out with or without a solvent. In the case where no solvent is used, the phenol compound may be charged in an amount preferably at least one equivalent, more preferably from 3 to 10 equivalents, to the 4-vinylcyclohexene and/or 5-vinylnorbornene. In the case of using a solvent, this solvent is not particularly limited as long as it does not inhibit the reaction. Preferred examples thereof include aromatic hydrocarbon compounds such as benzene, toluene, and xylene. The reaction temperature varies depending on the kind of the acid catalyst used. For example, in the case of using boron trifluoride/phenol complex, the reaction is conducted at a temperature of preferably from 20 to 170° C., more preferably from 40 to 150° C. Reaction temperatures exceeding 170° C. are undesirable in that catalyst decomposition or side reactions may occur. Reaction temperatures lower than 20° C. are undesirable in that such low temperatures are economically disadvantageous because the reaction is retarded.

The above reaction may be conducted in such a manner that 4-vinylcyclohexene and/or 5-vinylnorbornene is added gradually. This method is effective in preventing the 4-vinylcyclohexene and/or 5-vinylnorbornene from homopolymerizing.

After completion of the above reaction, the catalyst is filtered off or deactivated, and the solution thus obtained is concentrated to thereby obtain a polymer represented by general formula (IIc). Methods for catalyst removal vary depending on the kind of the catalyst used. For example, in the case where boron trifluoride/phenol complex was used, a preferred method comprises adding calcium hydroxide, magnesium hydroxide, or the like in an amount of from 1 to 10 times by mole the amount of the catalyst to deactivate the catalyst and then filtering off the catalyst. In the filtration, it is desirable to add a solvent or to heat or otherwise treat the reaction mixture to thereby improve the efficiency of filtration operation.

For hydrogenating the polymer represented by general formula (IIc) to obtain the polymer represented by general formula (IIIc), known methods can be used. For example, the polymer represented by general formula (IIc) is dissolved in a solvent and this solution is brought into contact with hydrogen in the presence of a metal catalyst.

The solvent is preferably one in which the polymer represented by general formula (IIc) readily dissolves and which is stable to the hydrogenation and can be easily removed after the hydrogenation. Preferred examples thereof include lower alcohols such as methanol, ethanol, propanol, and butanol, lower ketones such as acetone, methyl ethyl ketone, and methyl isobutyl ketone, and cyclic ethers such as tetrahydrofuran and dioxane. Also usable are phenols such as cresols. Especially preferred of these solvents are lower alcohols.

Preferred examples of the metal catalyst include nickel, cobalt, palladium, platinum, and rhodium. Such catalyst metals may be used either as they are or after having been fixed to a metal oxide support. In general, nickel and cobalt each is used alone in a Raney form or after having been fixed to a porous support such as silica, alumina, carbon, or diatomaceous earth. Noble metals are generally used in the form of an oxide or after having been fixed to a support. Although the use amount of the catalyst varies depending on the kind of the catalyst, an appropriate range thereof is generally as follows. The hydrogenation may be carried out either by a batch process in an autoclave or the like or by a continuous process in which the reaction mixture is passed through a fixed bed.

In the case of a batch process, an appropriate range of the catalyst amount is about from 0.01 to 10% by weight in terms of metal amount based on the polymer to be treated. In the case of a continuous flow process, an appropriate range of the catalyst amount is such that the WHSV of the polymer based on the catalyst is about from 0.1 to 10kg/kg·hr. In the case of a continuous flow process, a catalyst fixed to a support is generally used. The temperature for the hydrogenation is generally from 50 to 300° C., preferably from 150 to 250° C. The pressure of hydrogen is generally from 10 to 200 kg/cm$^2$, preferably from 50 to 100 kg/cm$^2$, from the standpoints of the reaction temperature, withstand pressure of the apparatus, etc. Any desired treatment period can be selected according to the conditions for the treatment, e.g., the kind and amount of the catalyst used and the treatment temperature, and to the properties of the polymer to be treated, etc. In the present invention, the degree of hydrogenation of the aromatic nuclei is preferably 60% or higher, more preferably 70% or higher, most preferably 80% or higher. Degrees of nucleus hydrogenation lower than 60% are undesirable in that the results are enhanced optical absorption at 193 nm and hence impaired resist profiles.

The method for obtaining the polymer represented by general formula (Vc) is explained next. The polymer represented by general formula (Vc) is obtained by esterifying the polymer represented by general formula (IIIc) with a carboxylic anhydride represented by general formula (IVc).

Examples of the carboxylic anhydride used for the esterification are the same as those enumerated hereinabove.

The esterification reaction can be conducted, for example, by the method described in R. P. Hanzilik, *Org. Synth.*, VI 560 (1988) or J. Cason, *Org. Synth.*, III, 169 (1955), whereby the target polymer is easily obtained. Specifically, the polymer represented by general formula (IIIc) is dissolved in a solvent together with a carboxylic anhydride represented by general formula (IVc) and the reactants are reacted with each other in the presence of a catalyst at a temperature of from 5 to 150° C. to obtain the target polymer. Examples of the solvent used here include benzene, toluene, xylene, DMF, and THF. The catalyst may be a basic catalyst, examples of which include pyridine, sodium acetate, 4-dimethylaminopyridine, and triethylamine.

In the esterification reaction, the polymer represented by general formula (IIIc) and the carboxylic anhydride represented by general formula (IVc) are charged preferably in such molar concentrations that the amount of the carboxylic anhydride represented by general formula (IVc) is from 0.5 to 2.0 mol per 1.0 mol of the polymer represented by general formula (IIIc). Charged amounts of the carboxylic anhydride smaller than 0.5 mol per mol of the polymer are undesirable in that the resultant polymer represented by general formula (Vc) has insufficient alkali solubility to give a resist which has reduced sensitivity or reduced resolution. On the other hand, if the charged amount of the carboxylic anhydride exceeds 2.0 mol per mol of the polymer, the acid anhydride forms a diester through alcoholysis. As a result, the polymer represented by general formula (Vc) tends to have insufficient alkali solubility and give a resist having reduced sensitivity. It is therefore preferred to control the reaction so that the acid anhydride forms a half ester through alcoholysis.

This positive photoresist composition included in the present invention may contain a polymer represented by general formula (Vc) (a polymer having a partial structure represented by general formula (Ic) but containing no acid-decomposable groups), an acid-decomposable dissolution inhibitor, and a photo-acid generator. However, it is preferred to incorporate acid-decomposable groups into the polymer represented by general formula (Vc) (the polymer having a structure represented by general formula (Ic)).

Acid-decomposable groups can be incorporated into the polymer represented by general formula (Vc) by protecting carboxyl groups of the polymer through an esterification reaction. Examples of this esterification reaction include a method in which the polymer represented by general formula (Vc) is esterified with a tertiary alcohol with the aid of 4-dimethylaminopyridine (DMAP) or the like (see G. Hoefle, W. Steglich, and Vorbrueggen, *Angew. Chem. Int. Ed. Engle.*, 17, 569 (1978)), a method in which trifluoroacetic anhydride is used (see R. C. Parish and L. M. Stock, *J. Org. Chem.*, 30, 927 (1965)), and a method in which DCC (dicyclohexylcarbodiimide) is used (see B. Neises and W. Steglich, *Org. Synth.*, 63, 183 (1985)).

Furthermore, a method may be used which comprises converting carboxyl groups of the polymer represented by general formula (Vc) into a carbonyl chloride with $SOCl_2$ or the like and then reacting the carbonyl chloride with an alcohol or metal alkoxide to form an ester. It is also possible to use the DCC-DMAP method.

Fourthly, the polymer (B) having a structure represented by formula (Id) is explained below.

The polymer (B) having a structural unit represented by general formula (Id) for use in the present invention is explained below.

Examples of the alkyl group represented by $R_{12}$ and $R_{13}$ in general formula (Id) include linear or branched alkyl groups having 1 to 10 carbon atoms which may be substituted. Specific examples thereof include methyl, ethyl, propyl, isopropyl, n-butyl, t-butyl, hydroxymethyl, and hydroxyethyl. Examples of the cycloalkyl group represented by $R_{12}$ and $R_{13}$ include cyclopentyl and cyclohexyl.

Examples of the alkoxy group represented by $R_{12}$ and $R_{13}$ include alkoxy groups which each has 1 to 10 carbon atoms and may have one or more substituents. Specific examples thereof include methoxy, ethoxy, n-butoxy, t-butoxy, propoxy, and isopropoxy.

Examples of the substituents of the groups described above include halogen atoms, cyano, and nitro.

Examples of the alkyl group and substituted alkyl group represented by $R_{14}$ are the same as those enumerated above with regard to $R_{12}$ and $R_{13}$. Examples of the cycloalkyl group represented by $R_{14}$ include cycloalkyl groups having 4 to 20 carbon atoms, such as cyclopentyl, cyclohexyl, adamantyl, norbornyl, tricyclodecanyl, tetracyclododecanyl, and tricyclopentyl. Examples of the substituents for these cycloalkyl groups include hydroxyl, halogen atoms, carboxyl, and alkyl or alkoxy groups having 1 to 4 carbon atoms.

Examples of the ring formed by $R_{12}$ and $R_{13}$ bonded to each other include the rings in which the bonded $R_{12}$ and $R_{13}$ constitute any of the following groups.

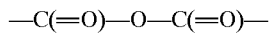

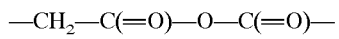

When —$COOR_{14}$ represents a group which decomposes by the action of an acid, examples of $R_{14}$ include hydrocarbon groups having 2 to 20 carbon atoms (e.g., t-butyl, norbornyl, and cyclodecanyl, tetrahydrofuranyl, tetrahydropyranyl), alkoxyethyl groups such as ethoxyethyl and isopropylethyl, lactone groups, and cyclohexyloxyethyl.

Examples of the bivalent organic group having 2 to 20 carbon atoms represented by $X_1$ include alkylene groups having 2 to 20 carbon atoms, such as ethylene and propylene, cycloalkylene groups having 4 to 20 carbon atoms, such as cyclobutylene and cyclohexylene, arylene groups having 6 to 20 carbon atoms, such as phenylene, and bivalent cycloolefin groups which may have a crosslink.

The partial structure represented by general formula (Id) may be contained in the main chain of the polymer or in a side chain thereof. In the present invention, however, the partial structure is preferably contained in the main chain of the polymer.

Examples of the polymer having repeating units each comprising the partial structure represented by general formula (I) include the polymers represented by the following formulae (a–1d) to (a–10d).

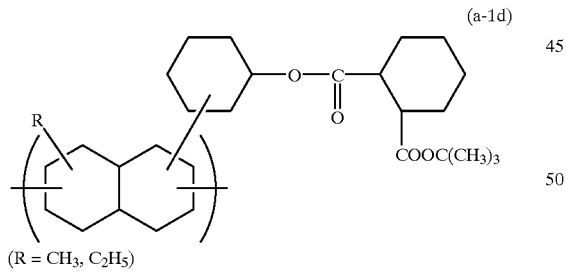

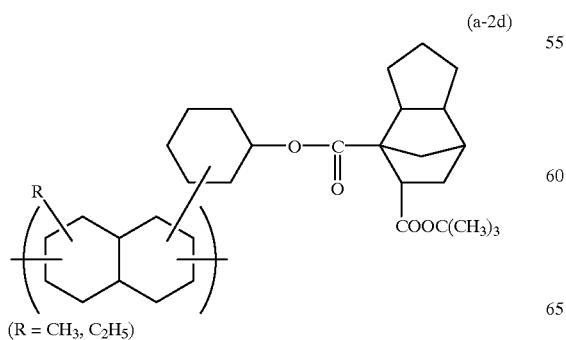

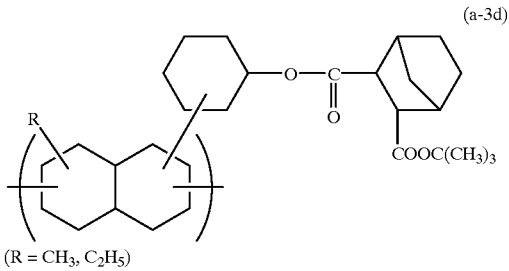

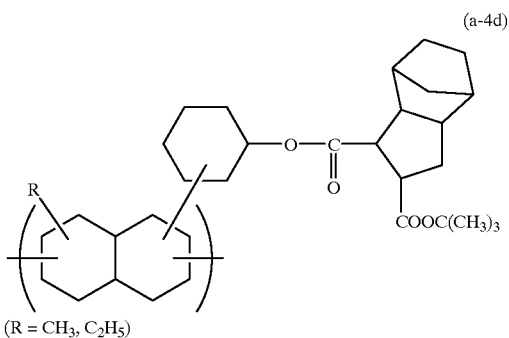

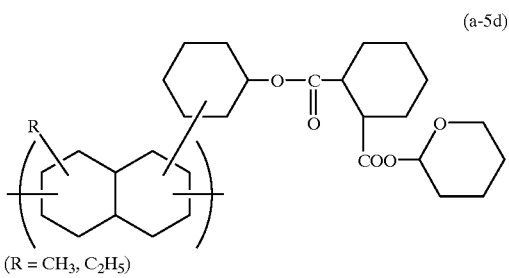

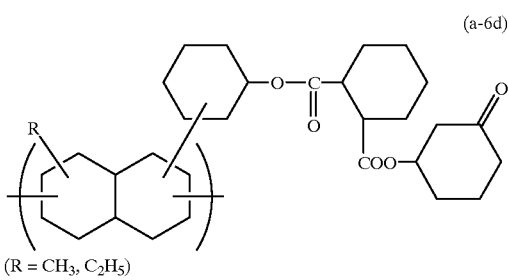

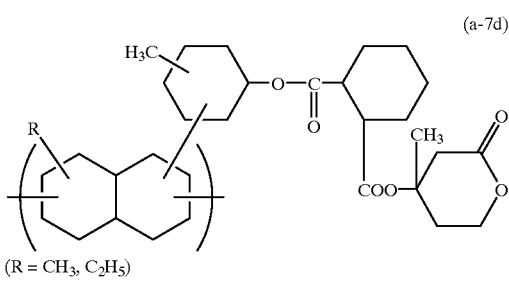

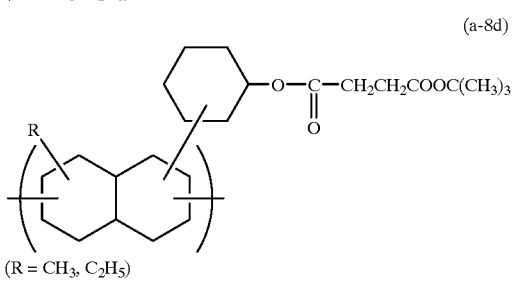

(a-9d)

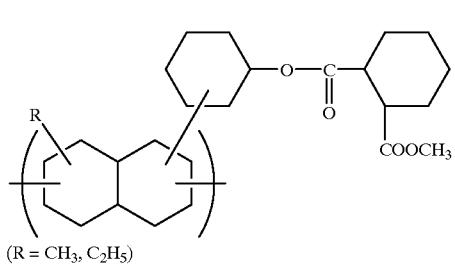

(R = CH₃, C₂H₅)

(a-10d)

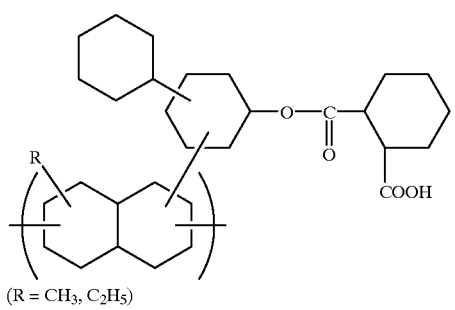

(R = CH₃, C₂H₅)

In the above polymer examples, R represents methyl or ethyl. However, a polymer comprising a mixture of partial structures represented by general formula (Id) wherein R is methyl and partial structures represented by general formula (Id) wherein R is ethyl is also included in the present invention.

In an example of processes for synthesizing a polymer (B), a phenol compound and polybutadiene are first subjected to an alkylation reaction in the presence of an acid catalyst to synthesize a polymer having structural units represented by the following general formula (IId). The polymer obtained is hydrogenated to obtain a polymer represented by the following general formula (IIId).

The polymer represented by general formula (IIId) is esterified with a carboxylic anhydride represented by general formula (IVd) to obtain a polymer represented by general formula (Vd).

The polymer represented by general formula (Vd) is further esterified with a given monomer according to need to thereby obtain a polymer having repeating units represented by and of (a–1d) to (a–10d).

(IId)

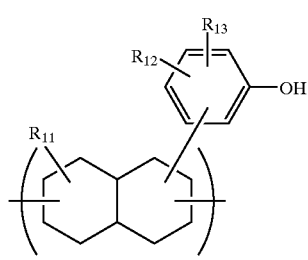

(IIId)

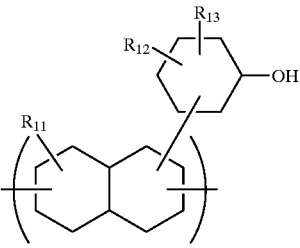

(IVd)

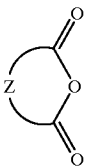

(Vd)

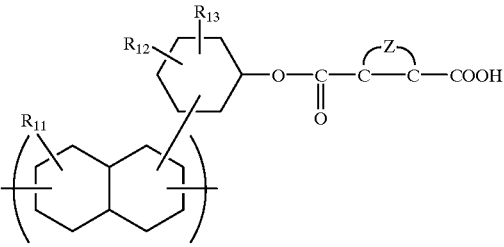

(IN the above formulae, $R_{11}$ to $R_{13}$ have the same meanings as those in general formula (Id); and Z represents a bivalent organic group.)

The above synthesis process is explained in detail. First, the polymer represented by general formula (IId) is synthesized by the method described in JP-A-7-41536 and JP-A-9-263672, in which a phenol compound and polybutadiene are subjected to an alkylation reaction in the presence of an acid catalyst to obtain the target polymer.

Examples of the acid catalyst include boron trifluoride, boron trifluoride complexes such as boron trifluoride/ether complexes and boron trifluoride/phenol complex, fluoroalkylsulfonic acids, fluoroalkylcarboxylic acids, arylsulfonic acids, aluminum phenoxide, sulfuric acid, p-toluenesulfonic acid, methanesulfonic acid, boron fluoride, boron fluoride/ether complexes, boron fluoride/phenol complex, aluminum chloride, and perchloric acid. Preferred from the standpoints of catalytic activity and catalyst removal are boron trifluoride/ether complexes and boron trifluoride/phenol complex. Especially preferred is boron trifluoride/phenol complex. Although the use amount of the acid catalyst is not particularly limited, it is generally from 5 to 50 mmol, preferably from 10 to 20 mmol, per 100 g of the polybutadiene.

In reacting polybutadiene and a phenol compound, addition reaction of the phenol compound to the polybutadiene occurs. Besides this reaction, the polymer further undergoes an intramolecular cyclization reaction. The reaction system therefore generates an exceedingly large quantity of heat of reaction. Consequently, the method most preferred for controlling the reaction temperature is to gradually add polybutadiene to a system comprising a phenol compound and an acid catalyst. Since the unreacted phenol compound in this reaction serves as a reaction solvent, there is no need of especially adding a reaction solvent. It is, however, possible to use a small amount of inert solvent for the purpose of lowering the viscosity of the reaction system. Examples of the inert solvent include hydrocarbons such as toluene and xylene and halogenated solvents such as chlorobenzene and dichloroethane. The temperature for the reaction of polybutadiene with a phenol compound is not particularly limited, and is preferably about from 25 to 220° C.

Examples of the phenol compound include phenol, o-cresol, m-cresol, p-cresol, t-butylphenol, cyclohexylphenol, p-cumylphenol, xylenes, and naphthols. In the reaction between polybutadiene and such a phenol compound, the charged amount of the phenol compound is generally from 1.2 to 20 equivalent, preferably from 2.5 to 12 equivalents, to all double bonds of the polybutadiene.

For hydrogenating the polymer represented by general formula (IId) to obtain the polymer represented by general formula (IIId), known methods can be used. For example, the polymer represented by general formula (IId) is dissolved in a solvent and this solution is brought into contact with hydrogen in the presence of a metal catalyst. The solvent is preferably one in which the polymer represented by general formula (IId) readily dissolves and which is stable to the hydrogenation and can be easily removed after the hydrogenation. Preferred examples thereof include lower alcohols such as methanol, ethanol, propanol, and butanol, lower ketones such as acetone, methyl ethyl ketone, and methyl isobutyl ketone, and cyclic ethers such as tetrahydrofuran and dioxane. Also usable are phenols such as cresols. Especially preferred of these solvents are lower alcohols.

Preferred examples of the metal catalyst include nickel, cobalt, palladium, platinum, and rhodium. Such catalyst metals may be used either as they are or after having been fixed to a metal oxide support. In general, nickel and cobalt each is used alone in a Raney form or after having been fixed to a porous support such as silica, alumina, carbon, or diatomaceous earth. Noble metals are generally used in the form of an oxide or after having been fixed to a support.

Although the use amount of the catalyst varies depending on the kind of the catalyst, an appropriate range thereof is generally as follows. The hydrogenation may be carried out either by a batch process in an autoclave or the like or by a continuous process in which the reaction mixture is passed through a fixed bed. In the case of a batch process, an appropriate range of the catalyst amount is about from 0.01 to 10% by weight in terms of metal amount based on the polymer to be treated. In the case of a continuous flow process, an appropriate range of the catalyst amount is such that the WHSV of the polymer based on the catalyst is about from 0.1 to 10 kg/kg·hr. In the case of a continuous flow process, a catalyst fixed to a support is generally used.

The temperature for the hydrogenation is generally from 50 to 300° C., preferably from 150 to 250° C. The pressure of hydrogen is generally from 10 to 200 kg/cm$^2$, preferably from 50 to 100 kg/cm$^2$, from the standpoints of the reaction temperature, withstand pressure of the apparatus, etc. Any desired treatment period can be selected according to the conditions for the treatment, e.g., the kind and amount of the catalyst used and the treatment temperature, and to the properties of the polymer to be treated, etc. In the present invention, the degree of hydrogenation of the aromatic nuclei is preferably 60% or higher, more preferably 70% or higher, most preferably 80% or higher. Degrees of nucleus hydrogenation lower than 60% are undesirable in that the results are enhanced optical absorption at 193 nm and hence impaired resist profiles.

The method for obtaining the polymer represented by general formula (Vd) is explained next. The polymer represented by general formula (Vd) is obtained by esterifying the polymer represented by general formula (IIId) with a carboxylic anhydride represented by general formula (IVd).

Examples of the carboxylic anhydride used for the esterification are the same as those enumerated hereinabove.

The esterification reaction can be conducted, for example, by the method described in R. P. Hanzilik, *Org. Synth.*, VI, 560 (1988) or J. Cason, *Org. Synth.*, III, 169 (1955), whereby the target polymer is easily obtained. Specifically, the polymer represented by general formula (IVd) is dissolved in a solvent together with a carboxylic anhydride represented by general formula (Vd) and the reactants are reacted with each other in the presence of a catalyst at a temperature of from 5 to 150° C. to obtain the target polymer. Examples of the solvent used here include benzene, toluene, xylene, DMF, and THF. The catalyst may be a basic catalyst, examples of which include pyridine, sodium acetate, 4-dimethylaminopyridine, and triethylamine.

In the esterification reaction, the polymer represented by general formula (IIId) and the carboxylic anhydride represented by general formula (IVd) are charged preferably in such molar concentrations that the amount of the carboxylic anhydride represented by general formula (IVd) is from 0.5 to 2.0 mol per 1.0 mol of the polymer represented by general formula (IIId). Charged amounts of the carboxylic anhydride smaller than 0.5 mol per mol of the polymer are undesirable in that the resultant polymer represented by general formula (Vd) has insufficient alkali solubility. On the other hand, if the charged amount of the carboxylic anhydride exceeds 2.0 mol per mol of the polymer, the acid anhydride forms a diester through alcoholysis. As a result, the polymer represented by general formula Vd) has insufficient alkali solubility and gives a resist having reduced sensitivity. It is therefore preferred to control the reaction so that the acid anhydride forms a half ester through alcoholysis.

This positive photoresist composition included in the present invention may contain a polymer represented by general formula (Vd) (a polymer (B) containing no acid-decomposable groups), an acid-decomposable dissolution inhibitor, and a photo-acid generator. However, it is preferred to incorporate acid-decomposable groups into the polymer represented by general formula (Vd). Namely, the partial structure represented by general formula (Id) preferably has an acid-decomposable group.

Acid-decomposable groups can be incorporated into the polymer represented by general formula (Vd) by protecting carboxyl groups of the polymer through an esterification reaction. Examples of this esterification reaction include a method in which the polymer represented by general formula (Vd) is esterified with a tertiary alcohol with the aid of 4-dimethylaminopyridine (DMAP) or the like (see G. Hoefle, W. Steglich, and Vorbrueggen, *Angew. Chem. Int. Ed. Engle.*, 17, 569 (1978)), a method in which trifluoroacetic anhydride is used (see R. C. Parish and L. M. Stock, *J. Org. Chem.*, 30, 927 (1965)), and a method in which DCC (dicylcohexylcarbodiimide) is used (see B. Neises and W. Steglich, *Org. Synth.*, 63, 183 (1985)).

Furthermore, a method may be used which comprises converting carboxyl groups of the polymer represented by general formula (Vd) into a carbonyl chloride with SOCl$_2$ or the like and then reacting the carbonyl chloride with an alcohol or metal alkoxide to form an ester. It is also possible to use the DCC-DMAP method.

In each of the above-described polymers (B) for use in the present invention, the content of repeating units each having a partial structure represented by general formula (Ia), (Ib), (Ic), or (Id) is preferably 50% by mole or higher, more preferably 60% by mole or higher, based on all repeating units.

In the case where the polymers (B) for use in the present invention contain acid-decomposable groups, the content of repeating units each having an acid-decomposable group in each polymer is preferably 20% by mole or higher, more preferably 30% by mole or higher, most preferably from 30 to 60% by mole, based on all repeating units.

Besides the repeating units having a partial structure represented by general formula (Ia), (Ib), (Ic), or (Id), other repeating units may be contained in each polymer (B) for use in the present invention.

The weight-average molecular weight of each polymer (B) is in the range of preferably from 1,500 to 100,000, more preferably from 2,000 to 70,000, most preferably from 3,000 to 50,000. Molecular weights thereof lower than 1,500 are undesirable in that dry-etching resistance, heat resistance, and adhesion to substrates are insufficient. Molecular weights thereof exceeding 100,000 are undesirable in that resist sensitivity is reduced. The molecular-weight distribution ($M_w/M_n$) thereof is preferably from 1.0 to 6.0, more preferably from 1.0 to 4.0. The smaller the value of molecular-weight distribution, the better the heat resistance and image performances (resist profile, defocus latitude, etc.).

The weight-average molecular weight and molecular-weight distribution ($M_w/M_n$) of each polymer (B) are determined in terms of standard polystyrene by gel permeation chromatography employing a refractive index meter.

In each positive photosensitive resin composition of the present invention, the content of the polymer (B) is generally from 50 to 99.7% by weight, preferably from 70 to 99% by weight, on a solid basis.

Besides the polymer (B), one or more other polymers can be contained in each positive photosensitive resin composition of the present invention. The content of other polymers is preferably up to 30 parts by weight, more preferably up to 20 parts by weight, most preferably up to 10 parts by weight, per 100 parts by weight of the polymer (B).

The optional polymers which can be contained in each positive photosensitive resin composition of the present invention may be any polymers compatible with the polymer (B). Examples thereof include poly(p-hydroxyethylene), hydrogenated poly(p-hydroxyethylene), novolak resins, and the alicyclic polymer described in Japanese Patent Application No. 10-112219.

Component (A)

The compound (A) which decomposes upon irradiation with actinic rays to generate an acid (hereinafter referred to also as "photo-acid generator (A)") which is contained in each positive photosensitive resin composition of the present invention will be explained next.

Examples of the photo-acid generator (a) for use in the present invention include photoinitiators for cationic photopolymerization, photoinitiators for radical photopolymerization, photodecolorants comprising dyes, optical color changes, and compounds which are known as photo-acid generators for use in micro photoresists and generate an acid upon irradiation with ultraviolet rays, far ultraviolet rays, KrF excimer laser light, ArF excimer laser light, electron beams, X-rays, molecular beams, ion beams, or the like. These photo-acid generators may be suitably used alone or as a mixture of two or more thereof.

In the present invention, the term "actinic rays" is used to mean a wide range of radiations including those enumerated above.

The photo-acid generator (A) is not particularly limited as long as it dissolves in those organic solvents usable in each positive photosensitive resin composition of the present invention which will be given later. However, photo-acid generators which generate an acid upon irradiation with a light having a wavelength of 220 nm or shorter are preferred. A single photo-acid generator or a combination of two or more photo-acid generators may be used. It is also possible to use a combination of one or more photo-acid generators with an appropriate sensitizer.

Examples of usable photo-acid generators (A) include the triphenylsulfonium salt derivatives given in, e.g., *J. Org. Chem.*, Vol. 43, No. 15, 3055 (1978) and the onium salts of other kinds given in Japanese Patent Application No. 9-279071 (i.e., sulfonium salts, iodonium salts, phosphonium salts, diazonium salts, and ammonium salts).

Specific examples of the onium salts include diphenyliodonium triflates, diphenyliodonium pyrenesulfonate, diphenyliodonium dodecylbenzenesulfonate, triphenylsulfonium triflates, triphenylsulfonium hexafluoroantimonate, diphenyliodonium hexafluoroantimonate, triphenylsulfonium naphthalenesulfonate, triphenylsulfonium camphorsulfonium (4-methoxyphenyl)phenyliodonium trifluoromethanesulfonate, and bis(t-butylphenyl)iodonium trifluoromethanesulfonate.

Other preferred examples of the photo-acid generator include the diazo disulfonate and diazo ketosulfones given in JP-A_3-103854, JP-A_3-103856, and JP-A-4-1210960, the iminosulfonates described in JP-A-64-18143 and JP-A-2-245756, and the disulfones given in JP-A-2-71270. Also usable are the polymeric compounds having, incorporated in the main chain or side chains thereof, groups generating an acid upon irradiation with light as described, e.g., in U.S. Pat. No. 3,849,137, JP-A-63-26653, JP-A-62-69263, JP-A-63-146038, JP-A-63-163452, JP-A-62-153853, and JP-A-63-146029. Still other preferred examples of the photo-acid generator include the aliphatic alkylsulfonium salts having a 2-oxocyclohexyl group as described in JP-A-7-25846, JP-A-7-28237, JP-A-7-92675, and JP-A-8-27120, N-hydroxysuccinimidesulfonates, and the sulfonium salts described in *J. Photopolym. Sci., Tech.*, Vol 7, No. 3, 423 (1994). These photo-acid generators may be used alone or in combination of two or more thereof.

The content of these compounds (A) which decompose upon irradiation with actinic rays to generate an acid is generally from 0.001 to 40% by weight, preferably from 0.01 to 20% by weight, more preferably from 0.1 to 5% by weight, based on the total amount of the photosensitive resin composition (on a solid basis). Contents of the photo-acid generator (A) lower than 0.001% by weight are undesirable in that sensitivity is reduced. Contents thereof higher than 40% by weight are undesirable in that the resist shows too high light absorption, resulting in a deteriorated profile and a narrowed process margin, especially a narrowed bake margin.

Component C

The nitrogen-containing basic compound (C) contained in each positive photosensitive resin composition of the present invention is explained next. The nitrogen-containing basic compound is not particularly limited as long as it does not impair sublimation or resist performances. Examples thereof include organic amines, basic ammonium salts, and sulfonium salts.

For examples, use can be made of the basic compounds given in, e.g., JP-A-63-149640, JP-A-5-249662, JP-A-5-

127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-12030, JP-A-9-274312, JP-A-9-166871, JP-A-9-292708, JP-A-9-325496, JP-A(PCT)-7-508840, U.S. Pat. Nos. 5,525,453, 5,629,134, and 5,667,938.

Especially preferred examples of the basic compound (C) include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazole and analogues thereof, hydroxypyridines, pyridine analogues, 4,4'-diaminodiphenyl ether, pyridinium p-toluenesulfonate, 2,4,6-trimethylpyridinium p-toluenesulfonate, tetramethylammonium p-toluenesulfonate, and tetrabutylammonium lactate.

Such basic compounds (C) can be used alone or in combination of two or more thereof.

The content of the nitrogen-containing basic compound (C) is generally from 0.001 to 10 parts by weight, preferably from 0.01 to 5 parts by weight, per 100 parts by weight of the photosensitive resin composition (on a solid basis). If the content thereof is below 0.001 part by weight, sufficient effects cannot be obtained. If the content thereof exceeds 10 parts by weight, this tends to result in reduced sensitivity and considerably impaired developability in unexposed areas.

Component D

The fluorine type and/or silicone type surfactant (D) contained in each positive photosensitive resin composition of the present invention will be explained next.

Each photosensitive resin composition of the present invention can contain any of a fluorine type surfactant, a silicone type surfactant, and a surfactant containing both fluorine atoms and silicon atoms, or can contain two or more of these surfactants.

Examples of such surfactants (D) include the surfactants described in U.S. Pat. Nos. 5,405,720, 5,360,692, 5,529,881, 5,296,330, 5436,098, 5,576,143, 5,294,511, and 5,824,451, JP-A-62-36663, JP-A-61-226746, JP-A-61-226745, JP-A-62-170950, JP-A-63-34540, JP-A-7-230165, JP-A-8-62834, JP-A-9-54432, and JP-A-9-5988. It is also possible to use the following commercial surfactants as they are.

Examples of usable commercial surfactants include fluorine type and/or silicone type surfactants such as F-Top EF301 and EF303 (manufactured by New Akita Chemical Company), Florad FC430 and FC431 (manufactured by Sumitomo 3M Ltd.), Megafac F171, F173, F176, F189, and R08 (manufactured by Dainippon Ink & Chemicals, Inc.), and Surflon S-382, SC-101, SC-102, SC-103, SC-104, SC-105, and SC-106 (manufactured by Asahi Glass Co., Ltd.). Polysiloxane polymer KP-341 (manufactured by Shin-Etsu Chemical Co., Ltd.) is also usable as a silicone type surfactant.

Especially preferred of these surfactants from the standpoint of mitigating development defects are the surfactants each containing both fluorine atoms and silicon atoms.

The incorporation amount of the surfactant (D) is generally from 0.01 to 2 parts by weight, preferably from 0.01 to 1 part by weight, per 100 parts by weight of the composition of the invention on a solid basis. Those surfactants can be used alone or in combination of two or more thereof.

Other Components

A low-molecular, acid-decomposable, dissolution inhibitive compound can be contained in each positive photosensitive resin composition of the present invention if desired and necessary. This compound has a molecular weight of 2,000 or lower, has one or more groups decomposable by the action of an acid, and comes to have enhanced alkali solubility by the action of an acid.

Examples of the low-molecular acid-decomposable compound are given in e.g., Proc. SPIE, 2724, 355 (1996), JP-A-8-15865, U.S. Pat. Nos. 5,310,619 and 5,372,912, and J. Photolym. Sci., Tech., Vol. 10, No. 3, 511 (1997). The examples include: alicyclic compounds such as cholic acid derivatives, dehydrocholic acid derivatives, deoxycholic acid derivatives, lithocholic acid derivatives, ursocholic acid derivatives, and abietic acid derivatives which each has one or more acid-decomposable groups; and aromatic compounds such as naphthalene derivatives having one or more acid-decomposable groups.

Furthermore, the low-molecular, acid-decomposable, dissolution inhibitive compound described in JP-A-6-51519 can be used in such a small amount as not to impair transmission at 220 nm. It is also possible to use 1,2-maphthoquinonediazide compounds.

In the case where the low-molecular, acid-decomposable, dissolution inhibitive compound described above is used in each of the photosensitive resin composition of the present invention, the content thereof is in the range of generally from 1 to 50% by weight, preferably from 3 to 40% by weight, more preferably from 5 to 30% by weight, based on the total amount of the photosensitive resin composition (on a solid basis).

The addition of the low-molecular, acid-decomposable dissolution inhibitive compound not only enhances the effect of mitigating development defects but also improves dry-etching resistance.

Each positive photosensitive resin composition of the present invention may optionally further contain other ingredients such as, e.g., a compound which enhances dissolution in a developing solution, antihalation agent, plasticizer, surfactant, photosensitizer, adhesion improver, crosslinking agent, and photo-base generator.

Examples of the compound which enhances dissolution in a developing solution which can be used in the present invention include low-molecular compounds having a molecular weight of 1,000 or lower such as the compounds having two or more phenolic hydroxyl groups as described, e.g., in JP-A-3-206458, naphthols including 1-naphthol, compounds having one or more carboxyl groups, carboxylic anhydrides, sulfonamide compounds, and sulfonylimide compounds.

The incorporation amount of these dissolution-enhancing compounds is preferably up to 30% by weight, more preferably up to 20% by weight, based on the total amount of the composition (on a solid basis).

Preferred antihalation agents are compounds which efficiently absorb the radiation with which the compositions are to be irradiated. Examples thereof include substituted benzenes such as fluorene, 9-fluorenone, and benzophenone, and polycyclic aromatic compounds such as anthracene, anthracene-9-methanol, anthracene-9-carboxyethyl, phenanthrene, perylene, and azilene. Especially preferred of these are the polycyclic aromatic compounds. These antihalation agents diminish light reflection by a substrate and lessen the influence of multiple reflection within the resist film to thereby produce the effect of improving standing waves.

A nonionic surfactant can be further added for the purpose of improving the applicability of each photosensitive resin composition of the present invention or improving developability.

Examples of nonionic surfactants which can be used together with the essential ingredients described above include polyoxyethylene lauryl ether, polyoxyethylene stearyl ether, polyoxyethylene oxtylphenyl ether, polyoxyethylene nonylphenyl ether, polyethylene glycol dilaurate, polyethylene glycol distearate, polyoxyethylene sorbitan monostearate, and sorbitan monolaurate.

A photosensitizer can be added in order to improve the efficiency of acid generation upon exposure. Preferred examples of the photosensitizer include benzophenone, p,p'-tetramethyldiaminobenzophenone, 2-chlorothioxanthone, anthrone, 9-ethoxyanthracene, pyrene, phenothiazine, benzil, benzoflavin, acetophenone, pheanthrene, benzoquinone, anthraquinone, and 1,2-naphthoquinone. However, the photosensitizers usable in the present invention should not be construed as being limited to these examples. These photosensitizers can be used also as the antihalation agent described above.

Each photosensitive resin composition in solution form of the present invention is prepared by dissolving the ingredients in a solvent in which they are soluble and then filtering the resultant solution through a filter usually having an opening diameter of, e.g., about from 0.05 to 0.2 μm. Examples of the solvent include ethylene glycol monoethyl ether acetate, cyclohexanone, 2-heptanone, propylene glycol monomethyl ether, propylene glycol monomethyl ether acetate, propylene glycol monoethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, λ-butyrolactone, and N,N-dimethylacetamide. These solvents may be used alone or in combination of two or more thereof.

Solvent selection is important because if influences the solubility of each photosensitive resin composition of the invention, applicability to substrates, storage stability, etc. Furthermore, solvents having a lower water content are preferred because the water contained therein influences these performances.

In the photosensitive resin compositions of the present invention, the content of impurities including metals and chlorine ions has preferably been reduced to 100 ppb or lower. A photosensitive resin composition containing such impurities in a large amount is undesirable in that semiconductor devices produced with the same may have operation failures or defects or use of the composition may lead to a reduced yield in semiconductor device production.

A photosensitive resin composition of the present invention is applied on a substrate by an appropriate coating means, e.g., a spinner or coater, and the coating film is subjected to pre-bake (pre-exposure heating) and then exposed to an exposure light having a wavelength of 220 nm or shorter through a given mask. The exposed film is subjected to PEB (post-exposure bake) and then developed, whereby a satisfactory resist pattern can be obtained.

The substrate used here is not particularly limited as long as it is a substrate ordinarily used in semiconductor and other devices. Examples thereof include silicon substrates, glass substrates, and nonmagnetic ceramic substrates. These substrates may have one or more additional layers optionally formed thereon, such as a silicon oxide layer, metal layer for wiring, interlaminar insulating film, magnetic film, and antireflection layer. The substrates may have various wirings, circuits, and the like which have been formed therein beforehand. Furthermore, these substrates may have been hydrophobized in an ordinary manner in order to heighten adhesion of a resist film thereto. Examples of appropriate hydrophobizing agents include 1,1,1,3,3,3-hexamethyldisilazane (HMDS).

The thickness of the resist film to be formed on a substrate by coating is preferably in the range of about from 0.1 to 10 μm. In the case of exposure with an ArF excimer laser, a thickness of about from 0.1 to 1.5 μm is recommended.

The resist film formed on the substrate is preferably pre-baked at a temperature of about from 60 to 160° C. for about from 30 to 300 seconds. Too low temperatures and too short periods for the pre-bake are undesirable in that the pre-baked resist film has a relatively large residual solvent amount and this brings about undesirable results such as e.g., impaired adhesion. On the other hand, too high temperatures and too long periods for the pre-bake are undesirable in that constituent components of the photosensitive resin composition, such as, e.g., the binder and photo-acid generator, are decomposed or other undesirable results are brought about.

For exposing the pre-baked resist film, a commercial illuminator may be used, such as, e.g., an ultraviolet illuminator, X-ray illuminator, electron beam illuminator, KrF excimer illuminator, ArF excimer illuminator, or $F_2$ excimer illuminator. In the present invention, it is especially preferred to use an illuminator employing an ArF excimer laser as an exposure light source.

Post-exposure bake is conducted for the purposes of causing the acid-catalyzed elimination of protective groups, eliminating standing waves, diffusing the acid generator or the like into the film, etc. This post-exposure bake can be conducted in the same manner as the pre-bake described above. For example, the baking temperature is generally about from 60 to 160° C., preferably about from 90 to 150° C.

As a developing solution for the photosensitive resin compositions of the present invention, use can be made of an aqueous solution of an alkali, e.g., an inorganic alkali such as sodium hydroxide, potassium hydroxide, sodium carbonate, sodium silicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide (TMAH), tetraethylammonium hydroxide (TEAH), trimethylhydroxymethylammonium hydroxide, triethylhydroxymethylammonium hydroxide, or trimethylhydroxyethylammonium hydroxide, or a cyclic amine such as pyrrole, piperidine, 1,8-diazabicyclo[5.4.0]-7-undecene, or 1,5-diazacyclo[4.3.0]-5-nonane.

Such an alkaline aqueous solution can contain an appropriate amount of additives, examples of which include hydrophilic organic solvents such as alcohols and ketones, nonionic or anionic surfactants, cationic surfactants, and anti-foaming agents. Besides being used for improving resist performances, these additives can be added to the alkaline aqueous solution for the purposes of, for example, enhancing adhesion to the substrate, reducing the use amount of the developing solution, and diminishing the defects attributable to bubbles present during development.

The present invention will be explained below in more detail by reference to Examples, but the invention should not be construed as being limited thereby.

SYNTHESIS EXAMPLE 1

(Synthesis of Polymer a-1)

Into a reaction vessel made of glass equipped with a thermometer and a stirrer were introduced 282 g (3 mol) of phenol and 8.2 g of ethanesulfonic acid as a catalyst. The contents were heated with stirring and held at 90° C. Thereto was dropwise added 132.2 g (1 mol) of dicyclopentadiene over 4 hours. After completion of the addition, the contents were heated to 150° C. and reacted at this temperature for 5 hours. After completion of the reaction, the resultant viscous reaction mixture was heated to 160° C. under vacuum to recover the unreacted phenol and other volatile substances by distillation. To the distillation reside was added 500 g of toluene to give a homogeneous solution. Upon-standing, this solution separated into two layers. The aqueous layer as the lower layer was discharged, and the toluene was removed from the toluene layer as the upper layer by vacuum distillation to obtain a polymer A' in an amount of 268 g. The weight-average molecular weight thereof was measured by GPC and was found to be 4,560. This polymer had a softening point of 128° C.

A solution prepared by dissolving 100 g of the polymer A' in 200 g of butanol and 3 g of a nickel catalyst supported on diatomaceous earth were introduced into an autoclave having a capacity of 1 L. The atmosphere in the autoclave was replaced with nitrogen several times and then with hydrogen several times. Thereafter, the hydrogen pressure inside the autoclave was adjustted to 50 kg/cm², and the contents were heated with stirring and held at 200° C. for 8 hours. After cooling, the resultant reaction mixture was filtered to remove the catalyst. The filtrate was dropped into a 10-fold amount by weight of water to precipitate a polymer. The precipitated polymer was collected and vacuum-dried at 50° C. to obtain 90 g of a polymer A". This polymer A" had a weight-average molecular weight of 4,790. The degree of hydrogenation of the phenolic nuclei thereof was calculated through IR and NMR spectrometry, and was found to be 95%.

Subsequently, 47 g of the polymer A" and 38 g of 1,2-cyclohexanedicarboxylic anhydride were introduced into a three-necked flask. Thereto was added 300 ml of THF to dissolve those ingredients. Into this solution was gradually dropped 19 g of sodium hydride to react the mixture at 40° C. for 6 hours. The resultant reaction mixture was poured into water to cause crystallization. After the reactants remaining unreacted were removed, the crystals were taken out by filtration and vacuum-dried at 50° C. to obtain 56 g of a polymer A'''. This polymer A''' had a weight-average molecular weight of 6,200.

Furthermore, a mixture of 20 g of the polymer A''' and 21 ml of thionyl chloride was refluxed for 1 hour. The excess thionyl chloride was removed, and the residual solid was dissolved in 90 ml of THF. To the solution was gradually added 8 g of potassium t-butoxide. This reaction mixture was refluxed for 6 hours, subsequently cooled, and then poured into water. The solid obtained was collected by filtration, washed with water, and then dried under vacuum. This purified reaction product was recrystallized from n-hexane to obtain polymer (a-1) according to the present invention. This polymer (a-1) had a weight-average molecular weight of 6,570 and a dispersion degree of 3.1.

SYNTHESIS EXAMPLE 2

(Synthesis of Polymer a-3)

The same procedure as in Synthesis Example 1 was conducted, except that 3,6-endomethylene-4,5-dihydro-1,2,3,6-tetrahydrophthalic anhydride was used in place of 1,2-cyclohexanedicarboxylic anhydride. Thus, polymer (a-3) according to the present invention was obtained. This polymer (a-3) had a weight-average molecular weight of 6,890 and a dispersion degree of 3.1.

SYNTHESIS EXAMPLE 3

(Synthesis of Polymer a-11)

In 80 g of THF was dissolved 20 g of the polymer A''' obtained in Synthesis Example 1. The dissolved polymer was reacted with 4.9 g of 3,4-dihydro-2H-pyran. The reaction product was coagulated with hexane to obtain polymer (a-11) according to the present invention. This polymer (a-11) had a weight-average molecular weight of 6,700 and a dispersion degree of 3.1.

SYNTHESIS EXAMPLE 4

(Synthesis of Polymer a-23)

The same procedure as in Synthesis Example 1 was conducted, except that α-naphthol was used in place of the phenol used as a starting material. Thus, polymer (a-23) according to the present invention was obtained. This polymer (a-23) had a weight-average molecular weight of 4,390 and a dispersion degree of 2.7.

SYNTHESIS EXAMPLE 5

(Synthesis of Acid-decomposable Low-molecular Compound a)

A mixture of 122.7 g (0.3 mol) of cholic acid and 120 ml of thionyl chloride was refluxed for 1 hour. The excess thionyl chloride was removed, and the residual solid was dissolved in 150 ml of tetrahydrofuran. To the solution was gradually added 40 g (0.35 mol) of potassium t-butoxide. This reaction mixture was refluxed for 6 hours, subsequently cooled, and then poured into water. The solid obtained was collected by filtration, washed wtih water, and then dried under vacuum. This crude reaction product was recrystallized from n-hexane to obtain t-butyl cholate (represented by the following formula) in a yield of 70%.

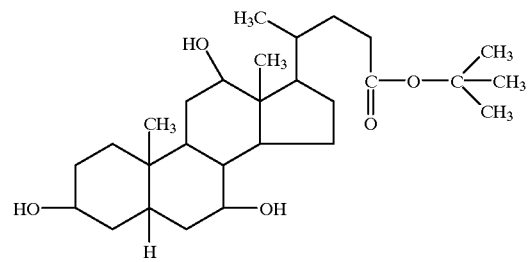

SYNTHESIS EXAMPLE 6

(Synthesis of Polymer (b-1): Comparative Example)

A copolymer of 1-cyclohexyl-3-carboxylic acid and t-butyl methacrylate was obtained according to the method described in the Synthesis Example 1 disclosed in JP-A-9-325498.

SYNTHESIS EXAMPLE 7

(Synthesis of Polymer (b-2): Comparative Example)

A copolymer of norbornenedicarboxylic acid, t-butyl methacrylate, and methyl acrylate was obtained according to the method described in the Synthesis Example 6 disclosed in JP-A-9-325498.

EXAMPLES 1 TO 4 AND COMPARATIVE EXAMPLES 1 TO 4

(Preparation of Photosensitive Resin Compositions)

Photosensitive resin compositions were prepared from the ingredients shown in Table 1. Namely, the ingredients used were: a polymer selected from polymers (a-1), (a-3), (a-11), and (a-23) synthesized in Synthesis Examples 1 to 4 and polymers (b-1) and (b-2) synthesized in Synthesis Examples 6 and 7; triphenylsulfonium triflate (PAG-1) as a photo-acid generator; the acid-decomposable low-molecular compound a synthesized in Synthesis Example 5; a nitrogen-containing basic compound; a surfactant; and a solvent. In Table 1, each broke line means that the ingredient was omitted.

The ingredients were mixed together and the mixture was filtered through a 0.1-$\mu$m Teflon filter to prepare a photosensitive resin composition.

The ingredients, when used, were incorporated in the following respective amounts.

| | |
|---|---|
| Polymer | 9.0 g |
| photo-acid generator | 0.10 g |
| Acid-decomposable low-molecular compound a | 1.0 g |
| Nitrogen-containing basic compound | 0.01 g |
| Surfactant | 0.003 g |
| Solvent | 55.12 g |

TABLE 1

Formulations for positive photosensitive resin compositions

| | Polymer | Photo-acid generator | Acid-decomposable low-molecular compound | Nitrogen containing basic compound | Surfactant | Solvent |
|---|---|---|---|---|---|---|
| Example 1 | (a-1) | PAG-1 | — | N-1 | W-1 | S-2 |
| Example 2 | (a-3) | PAG-1 | — | N-2 | W-1 | S-1 |
| Example 3 | (a-11) | PAG-1 | compound a | N-3 | W-2 | S-2 |
| Example 4 | (a-23) | PAG-1 | compound a | N-1 | W-2 | S-1 |
| Comparative Example 1 | (a-1) | PAG-1 | — | — | — | S-1 |
| Comparative Example 2 | (a-3) | PAG-1 | — | — | W-1 | S-1 |
| Comparative Example 3 | (b-1) | PAG-1 | — | N-1 | W-1 | S-1 |
| Comparative Example 4 | (b-2) | PAG-1 | compound a | N-3 | W-2 | S-2 |

PAG-1: triphenylsulfonium triflate
N-1: 1,5-diazabicyclo[4.3.0]-5-nonene
N-2: 1,8-diazabicyclo[5.4.0]-7-undecene

TABLE 1-continued

Formulations for positive photosensitive resin compositions

N-3: 1,4-diazabicyclo[2.2.2]octane
W-1: Megafac F176 (fluorine type surfactant manufactured by Dainippon Ink & Chemicals, Inc.)
W-2: Megafac R08 (fluorine and silicone type surfactant manufactured by Dainippon Ink & Chemicals, Inc.)
S-1: propylene glycol monomethyl ether acetate
S-2: ethyl lactate The photosensitive resin compositions thus prepared were evaluated for the number of development defects, image performance of resist, and dry-etching resistance by the following methods. The results of evaluation for development defects, those of evaluation for image performance, and those of evaluation for dry-etching resistance are shown in Tables 1, 2, and 3, respectively.

(Method of Evaluation for Image Defects)

(1) Number Image Defects I

Each photosensitive resin composition was evenly applied with a spin coater to a silicon substrate treated with hexamethyldisilazane, and the coating was dried on a hot plate at 140° C. for 90 seconds to form a resist film having a thickness of 0.50 $\mu$m. This resist film was exposed to ArF excimer laser light through a mask and, immediately thereafter, heated on a hot plate at 140° C. for 90 seconds. Subsequently, the resist film was developed with a 2.38% aqueous solution of tetramethylammonium hydroxide at 23° C. for 60 seconds, rinsed with pure water for 30 seconds, and then dried. The patterned sample thus obtained was examined with KLA 2112, manufactured by KLA Tencol Co. to count the number of development defects (threshold, 12; pixcel size, 0.39).

(2) Number of Image Defects II

A sample was obtained in the same manner as in "(1) Number of Image Defects I" above, except that the resist film was heated, developed, rinsed, and dried without being exposed. This sample was examined in the same manner to count the number of development defects.

(Method of Image Evaluation)

A 0.50-$\mu$m resist film was formed in the same manner as in "(1) Number of Image Defects I" above. This film was exposed, heated, developed, rinsed, and dried in the same manner. Thereafter, the thickness of the film was measured with a film thickness meter to determine the residual film ratio.

Furthermore, the profiles of the thus-formed line pattern having a line with a 0.20 $\mu$m were examined with a scanning electron microscope. The patterns having rectangular profiles are indicated by A, while those whose profiles were not rectangular are indicated by B. Resolution is shown in terms of threshold resolution at the exposure amount necessary for reproducing a 0.30-$\mu$m mask pattern.

(Determination of Dry-etching Resistance)

Each photosensitive resin composition shown in Table 1 was filtered through a Teflon filter having an opening diameter of 0.1 μm. The composition was then evenly applied to a silicon substrate with a spin coater and dried on a hot plate at 130° C. for 90 seconds to form a resist film having a thickness of 0.70 μm. The film obtained was etched with $CF_4/O_2$ (8/2) gas by means of a reactive ion etching apparatus (CSE-1110) manufactured by ULVAC Corp. to determine the rate of etching. The results obtained are shown in Table 4 below.

TABLE 2

Number of development defects

|  | Number of development defects I | Number of development defects II |
|---|---|---|
| Example 1 | 2 | 3 |
| Example 2 | 2 | 4 |
| Example 3 | 1 | 1 |
| Example 4 | 2 | 2 |
| Comparative Example 1 | 23 | 35 |
| Comparative Example 2 | 15 | 16 |
| Comparative Example 3 | 5 | 6 |
| Comparative Example 4 | 3 | 4 |

TABLE 3

Image performance of resist

|  | Residual Film Ratio (%) | Profile | Threshold resolution (μm) |
|---|---|---|---|
| Example 1 | 99.8 | A | 0.15 |
| Example 2 | 99.8 | A | 0.15 |
| Example 3 | 99.9 | A | 0.13 |
| Example 4 | 99.9 | A | 0.13 |
| Comparative Example 1 | 99.7 | A | 0.15 |
| Comparative Example 2 | 99.4 | A | 0.15 |
| Comparative Example 3 | 98.0 | B | 0.28 |
| Comparative Example 4 | 97.2 | B | 0.23 |

TABLE 4

Dry-etching resistance of resist; rate of dry etching

|  | Rate of etching (Å/min) |
|---|---|
| Example 1 | 700 |
| Example 2 | 720 |
| Example 3 | 770 |
| Example 4 | 730 |
| Comparative Example 1 | 705 |
| Comparative Example 2 | 715 |
| Comparative Example 3 | 980 |
| Comparative Example 4 | 930 |

As apparent form the results given in Table 2, the photosensitive resin compositions according to the present invention each gave a resist film having few development defects. In contrast, the compositions obtained in Comparative Examples 1 and 2, which did not contain at least either of a nitrogen-containing basic compound (C) and a surfactant (D), were inferior in development defects.

As apparent from the results given in Table 3, the photosensitive resin compositions according to the present invention each was significantly superior in the residual film ratio, resolution, and profile. In contrast, the compositions obtained in Comparative Examples 3 and 4 were inferior especially in resolution and profile.

As apparent form the results given in Table 4, the photosensitive resin compositions according to the present invention each gave a resist film having excellent dry-etching resistance. In contrast, the resist films obtained from the compositions of Comparative Example 3 and 4 had poor dry-etching resistance.

The present invention will be explained further in detail by reference to the following Examples, in which polymers having a partial structure represented by formula (1b) were used. However, the invention should not be construed as being limited by these Examples.

SYNTHESIS EXAMPLE 1b (Synthesis of Polymer a-1b)

Into a reaction flask having a capacity of 500 ml was introduced 188 g of phenol. The phenol was melted by heating to 80° C. Thereto was added 1.42 g of boron trifluoride ethyl ether. While this mixture was kept being stirred, 66 g of dicyclopentadiene was added dropwise thereto over 3 hours. Thereafter, 61.7 g of 35% aqueous formaldehyde solution was added dropwise thereto at 100° C. over 2 hours, and the resultant mixture was reacted for further 1 hour to obtain a reaction mixture containing a modified phenolic resin. The phenol remaining unreacted was removed from the reaction mixture was vacuum distillation at 100 to 180° C., and 550 g of toluene was added to the residue to dissolve the same. To the solution was added 900 g of ion-exchanged water. The resultant mixture was shaken to wash the toluene solution. After this washing operation was conducted five or more time, the toluene and other volatile substances were removed form the toluene solution by vacuum distillation at 100 to 180° C. the residue was cooled to obtain about 220 g of a modified phenolic resin (polymer Ab').

A solution prepared by dissolving 100 g of the polymer Ab' in 200 g of ethanol and 3 g of a nickel catalyst supported on diatomaceous earth were introduced into a autoclave having a capacity of 1 L. The atmosphere in the autoclave was replaced with nitrogen several times and then with hydrogen several times. Thereafter, the hydrogen pressure inside the autoclave was adjusted to 50 kg/cm$^2$, and the contents were heated with stirring and held at 200° C. for 8 hours. After cooling, the resultant reaction mixture was filtered to remove the catalyst. The filtrate was dropped into a 10-fold amount by weight of water to precipitate a polymer. The precipitated polymer was collected and vacuum-dried at 50° C. to obtain 90 g of a polymer Ab". This polymer Ab" had a weight-average molecular weight of 4,960. the degree of hydrogenation of the phenolic nuclei thereof was calculated through IR and NMR spectormetry, and was found to be 92%.

Subsequently, 56 g of the polymer Ab" and 38 g of 1,2-cyclohexanedicarboxylic anhydride were introduced into a three-necked flask. Thereto was added 300 ml of THF to dissolve those ingredients. Into this solution was gradually dropped 19 g of pyridine to react the mixture at 40° C. for 6 hours. The resultant reaction mixture was poured into water to cause crystallization. After the reactants remaining unreacted were removed, the crystals were taken out by filtration and vacuum-dried at 50° C. to obtain 56 g of a polymer Ab'". This polymer Ab'" had a weight-average molecular weight of 6,780.

Furthermore, a mixture of 20 g of the polymer Ab'" and 21 ml of thionyl chloride was refluxed for 1 hour. The excess thionyl chloride was removed, and the residual solid was dissolved in 90 ml of THF. To the solution was gradually added 8 g of potassium t-butoxide. This reaction mixture was refluxed for 6 hours, subsequently cooled, and then poured into water. The solid obtained was collected by filtration, washed with water, and then dried under vacuum. This purified reaction product was recrystallized form n-hexane to obtain polymer (a-1) according to the present invention. This polymer (a-1) had a weight-average molecular weight of 6,920 and a dispersion degree of 3.0.

SYNTHESIS EXAMPLE 2b (Synthesis of Polymer a-2b)

The same procedure as in Synthesis Example 1b was conducted, except that 3,6-endomethylene-4,5-dihydro-1,2, 3,6,-tetrahydrophthalic anhydride was used in place of 1,2-cyclohexanedicarboxylic anhydride. Thus, polymer (a-3b) according to the present invention was obtained. This polymer (a-3b) had a weight-average molecular weight of 6,890 and a dispersion degree of 3.0.

SYNTHESIS EXAMPLE 3b (Synthesis of Polymer a-6b)

In 80 g of THF was dissolved 20 g of the polymer Ab''' obtained in Synthesis Example 1b. The dissolved polymer was reacted with 4.9 of 3,4-dihydro-2H-pyran. The reaction product was coagulated with hexane to obtain polymer (a-6b) according to the present invention. This polymer (a-6b) had a weight-average molecular weight of 6,700 and a dispersion degree of 3.0.

SYNTHESIS EXAMPLE 4b (Synthesis of Polymer a-12b)

The same procedure as in Synthesis Example 1b was conducted, except that α-naphthol was used in place of the phenol used as a starting material. Thus, polymer (a-12b) according to the present invention was obtained. This polymer (a-12b) had a weight-average molecular weight of 4,230 and a dispersion degree of 2.6.

EXAMPLES 1b TO 4b AND COMPARATIVE EXAMPLES 1b TO 4b (Preparation of Photosensitive Resin Compositions)

Photosensitive resin compositions were prepared from the ingredients shown in Table 5. Namely, the ingredients used were: a polymer selected from polymers (a-1b), (a-2b), (a-6b), and (a-12b) synthesized in Synthesis Examples 1b to 4b and polymers (b-1) and (b-2) synthesized in Synthesis Examples 6 and 7; triphenylsulfonium triflate (PAG-1) as a photo-acid generator; the acid-decomposable low=molecular compound a synthesized in Synthesis Example 5; a nitrogen-containing basic compound; a surfactant; and a solvent. In Table 5, each broken line means that the ingredient was omitted.

The ingredients were mixed together and the mixture was filtered through a 0.1-μm Teflon filter to prepared a photosensitive resin composition.

The ingredients, when used, were incorporated in the following respective amounts.

| | |
|---|---|
| Polymer | 9.0 g |
| Photo-acid generator | 0.10 g |
| Acid-decomposable low-molecular compound a | 1.0 g |
| Nitrogen-containing basic compound | 0.01 g |
| Surfactant | 0.003 g |
| Solvent | 55.12 g |

TABLE 5

Formulations for positive photosensitive resin compositions

| | Polymer | Photo-acid generator | Acid-decomposable low-molecular compound | Nitrogen containing basic compound | Surfactant | Solvent |
|---|---|---|---|---|---|---|
| Example 1b | (a-1b) | PAG-1 | — | N-1 | W-1 | S-2 |
| Example 2b | (a-2b) | PAG-1 | — | N-2 | W-1 | S-1 |
| Example 3b | (a-6b) | PAG-1 | compound a | N-3 | W-2 | S-2 |
| Example 4b | (a-12b) | PAG-1 | compound a | N-1 | W-2 | S-1 |
| Comparative Example 1b | (a-1b) | PAG-1 | — | — | — | S-1 |
| Comparative Example 2b | (a-2b) | PAG-1 | — | — | W-1 | S-1 |
| Comparative Example 3b | (b-1) | PAG-1 | — | N-1 | W-1 | S-1 |
| Comparative Example 4b | (b-2) | PAG-1 | compound a | N-3 | W-2 | S-2 |

The photosensitive resin compositions thus prepared were evaluated for the number of development defects, image performance of resist, and dry-etching resistance by the same methods as in the preceding Examples. The results of evaluation for development defects, those of evaluation for image performance, and those of evaluation for dry-etching resistance are shown in Tables 6, 7, and 8, respectively.

TABLE 6

| | Number of development defects I | Number of development defects II |
|---|---|---|
| Example 1b | 1 | 2 |
| Example 2b | 2 | 3 |
| Example 3b | 1 | 1 |
| Example 4b | 1 | 2 |
| Comparative Example 1b | 22 | 31 |
| Comparative Example 2b | 13 | 12 |
| Comparative Example 3b | 5 | 6 |
| Comparative Example 4b | 3 | 4 |

TABLE 7

Image performance of resist

|  | Residual Film Ratio (%) | Profile | Threshold resolution (μm) |
|---|---|---|---|
| Example 1b | 99.8 | A | 0.16 |
| Example 2b | 99.9 | A | 0.15 |
| Example 3b | 99.8 | A | 0.13 |
| Example 4b | 99.9 | A | 0.13 |
| Comparative Example 1b | 99.7 | A | 0.16 |
| Comparative Example 2b | 99.4 | A | 0.15 |
| Comparative Example 3b | 98.0 | B | 0.28 |
| Comparative Example 4b | 97.2 | B | 0.23 |

TABLE 8

Dry-etching resistance of resist; rate of dry etching

|  | Rate of etching (Å/min) |
|---|---|
| Example 1b | 720 |
| Example 2b | 730 |
| Example 3b | 700 |
| Example 4b | 710 |
| Comparative Example 1b | 720 |
| Comparative Example 2b | 730 |
| Comparative Example 3b | 980 |
| Comparative Example 4b | 930 |

As apparent from the results given in Table 6, the photosensitive resin compositions according to the present invention each gave a resist film having few development defects. In contracts, the compositions obtained in Comparative Examples 1b and 2b, which did not contain at least either of a nitrogen-containing basic compound (C) and a surfactant (D), were inferior in development defects.

As apparent from the results given in Table 7, the photosensitive resin compositions according to the present invention each was significantly superior in the residual film ratio, resolution, and profile. In contrast, the compositions obtained in Comparative Examples 3b and 4b were inferior in resolution and profile.

As apparent form the results given in Table 8, the photosensitive resin compositions according to the present invention each gave a resist film having excellent dry-etching resistance. In contrast, the resist films obtained from the compositions of Comparative Examples 3b and 4b had poor dry-etching resistance.

The present invention will be explained further in detail by reference to the following Examples, in which polymers having a partial structure represented by formula (Ic) were used. However, the invention should not be construed as being limited by these Examples.

SYNTHESIS EXAMPLE 1c (Synthesis of Polymer a-1c)

Into a 2.5-L reaction vessel equipped with a reflux condenser and a Liebig condenser were introduced 800 g of phenol and 150 g of toluene. The contents were heated to 170° C. and 250 g of toluene was distilled off. The system was dehydrated until it came to have a water content of 50 ppm. Subsequently, the system was cooled to 80° C. and 19 g of boron trifluoride/phenol complex was added. While the temperature of this reaction mixture was kept at 80° C., 185 g of 5-vinylnorbornene having a water concentration of 20 ppm was gradually dropped therein to over 1.5 hours. After completion of the addition, the reaction mixture was continuously reacted for further 40 minutes at 80° C., subsequently heated to 140° C., and then stirred at this temperature for 2.5 hours. Thereafter, 40 g of magnesium compound "KW-1000" (trade name; manufactured by Kyowa Chemical Industry Co., Ltd.) was added and the resultant mixture was stirred for 60 minutes to deactivate the catalyst. The reaction mixture was then filtered thorough a filter paper covered with a Celite. The clear filtrate thus obtained was distilled at 230° C. under reduced pressure to obtain 270 g of a polymer Ac'.

A solution prepared by dissolving 100 g of the polymer Ac' in 200 g of t-butyl alcohol and 3.5 g of a nickel catalyst supported on diatomaceous earth were introduced into an autoclave having a capacity of 1 L. The atmosphere in the autoclave was replaced with nitrogen several times and then with hydrogen several times. Thereafter, the hydrogen pressure inside the autoclave was adjusted to 50 kg/cm$^2$, and the contents were heated with stirring and held at 200° C. for 10 hours.

After cooling, the resultant reaction mixture was filtered to remove the catalyst. The filtrate was dropped into a 10-fold amount by weight of water to precipitate a polymer. The precipitated polymer was collected and vacuum-dried at 50° C. to obtain 82 g of a polymer Ac". this polymer Ac" had a weight-average molecular weight of 4,210. The degree of hydrogenation of the phenolic nuclei thereof was calculated through IR and NMR spectormetry, and was found to be 93%.

Subsequently, 53 g of the polymer Ac" and 39 g of 1,2-cyclohexanedicarboxylic anhydride were introduced into a three-necked flask. Thereto was added 300 ml of THF to dissolve those ingredients. Into this solution was gradually dropped 20 g of sodium hydride to react the mixture at 40° C. for 6 hours. the resultant reaction mixture was poured into water to cause crystallization. After the reactants remaining unreacted were removed, the crystals were taken out by filtration and vacuum-dried at 50° C. to obtain 53 g of a polymer Ac'''.This polymer Ac''' had a weigh-average molecular weight of 5,480.

Furthermore, a mixture of 20 g of the polymer Ac''' and 23 ml of thionyl chloride was refluxed for 1 hour. The excess thionyl chloride was removed, and the residual solid was dissolved. in 90 ml of THF. To the solution was gradually added 8.7 g of potassium t-butoxide. This reaction mixture was refluxed for 6 hours, subsequently cooled, and then poured into water. The solid obtained was collected by filtration, washed with water, and then dried under vacuum. This purified reaction product was recrystallized from n-hexane to obtain polymer (a-1c) according to the present invention. This polymer (a-1c) had a weight-average molecular weight of 5,940 and a dispersion degree of 3.0.

SYNTHESIS EXAMPLE 2c (Synthesis of Polymer a-10c)

The same procedure as in Synthesis Example 1c was conducted, except that 4-vinylcyclohexene was used in place of 5-vinylnorbornene. Thus, polymer (a-10c) according to the present invention was obtained This polymer (a-10c) had a weight-average molecular weight of 7.090 and a dispersion degree of 3.0.

SYNTHESIS EXAMPLE 3c (Synthesis of Polymer a-11c)

In 80 g of THF was dissolved 20 g of the polymer Ac''' obtained in Synthesis Example 1c. The dissolved polymer was reacted with 5.2 g of 3,4-dihydro-2H-pyran. The reaction product was coagulated with hexane to obtain polymer (a-11c) according to the present invention. This polymer (a-11c) had a weight-average molecular weight of 5,640 and a dispersion degree of 3.0.

SYNTHESIS EXAMPLE 4c (Synthesis of Polymer a-23c)

The same procedure as a Synthesis Example 1c was conducted, except that α-naphthol was used in place of the phenol used as a starting material. Thus, polymer (a-23c) according to the present invention was obtained. This polymer (a-23c) had a weight-average molecular weight of 4,310 and a dispersion degree of 2.3.

EXAMPLES 1c TO 4c AND COMPARATIVE EXAMPLES 1c TO 4c (Preparation of Photosensitive Resin Compositions)

Photosensitive resin compositions were prepared from the ingredients shown in Table 9. Namely, the ingredients used were: a polymer selected from polymers (a-1c), (a-10c), (a-11c), and (a-23c) synthesized in Synthesis Examples 1c to 4c and polymers (b-1) and (b-2) synthesized in Synthesis Examples 6 and 7; thriphenylsulfonium triflate (PAG-1) as a photo-acid generator; the acid-decomposable low-molecular compound a synthesized in Synthesis Example 5; a nitrogen-containing basic compound; a surfactant; and a solvent. In Table 9, each broken line means that the ingredient was omitted.

The ingredients were mixed together and the mixture was filtered through a 0.1-$\mu$m Teflon filter to prepare a photosensitive resin composition. The ingredients were incorporated in the following respective amounts.

| | |
|---|---|
| Polymer | 9.0 g |
| Photo-acid generator | 0.10 g |
| Acid-decomposable low-molecular compound a | 1.0 g |
| Nitrogen-containing basic compound | 0.01 g |
| Surfactant | 0.003 g |
| Solvent | 55.12 g |

TABLE 9

Formulations for positive photosensitive resin compositions

| | Polymer | Photo-acid generator | Acid-decomposable low-molecular compound | Nitrogen containing basic compound | Surfactant | Solvent |
|---|---|---|---|---|---|---|
| Example 1c | (a-1c) | PAG-1 | — | N-1 | W-1 | S-2 |
| Example 2c | (a-10c) | PAG-1 | N-2 | | W-1 | S-1 |
| Example 3c | (a-11c) | PAG-1 | Compound a | N-3 | W-2 | S-2 |
| Example 4c | (a-23c) | PAG-1 | Compound a | N-1 | W-2 | S-1 |
| Comparative Example 1c | (a-1c) | PAG-1 | — | — | — | S-1 |

TABLE 9-continued

Formulations for positive photosensitive resin compositions

| | Polymer | Photo-acid generator | Acid-decomposable low-molecular compound | Nitrogen containing basic compound | Surfactant | Solvent |
|---|---|---|---|---|---|---|
| Comparative Example 2c | (a-10c) | PAG-1 | — | — | W-1 | S-1 |
| Comparative Example 3c | (b-1) | PAG-1 | — | N-1 | W-1 | S-1 |
| Comparative Example 4c | (b-2) | PAG-1 | compound a | N-3 | W-2 | S-2 |

The photosensitive resin compositions thus prepared were evaluated for the number of development defects, image performance of resist, and dry-etching resistance by the same methods as in the preceding Examples. The results of evaluation for development defects, those of evaluation for image performance, and those of evaluation for dry-etching resistance are shown in Tables 10, 11, and 12 respectively.

TABLE 10

| | Number of development defects I | Number of development defects II |
|---|---|---|
| Example 1c | 1 | 2 |
| Example 2c | 2 | 2 |
| Example 3c | 1 | 1 |
| Example 4c | 1 | 2 |
| Comparative Example 1c | 29 | 39 |
| Comparative Example 2c | 16 | 17 |
| Comparative Example 3c | 5 | 7 |
| Comparative Example 4c | 4 | 4 |

TABLE 11

Image performance of resist

| | Residual Film Ratio (%) | Profile | Threshold resolution ($\mu$m) |
|---|---|---|---|
| Example 1c | 99.7 | A | 0.16 |
| Example 2c | 99.4 | A | 0.15 |
| Example 3c | 99.9 | A | 0.13 |
| Example 4c | 99.9 | A | 0.13 |
| Comparative Example 1c | 99.7 | A | 0.16 |
| Comparative Example 2c | 99.4 | A | 0.15 |
| Comparative Example 3c | 98.2 | B | 0.28 |
| Comparative Example 4c | 97.4 | B | 0.23 |

TABLE 12

Dry-etching resistance of resist; rate of dry etching

|  | Rate of etching (Å/min) |
|---|---|
| Example 1c | 750 |
| Example 2c | 790 |
| Example 3c | 700 |
| Example 4c | 710 |
| Comparative Example 1c | 750 |
| Comparative Example 2c | 780 |
| Comparative Example 3c | 980 |
| Comparative Example 4c | 930 |

As apparent form the results given in Table 10, the photosensitive resin compositions according to the present invention each gave a resist film having few development defects. In contrast, the compositions obtained in Comparative Examples 1c and 2c, which did not contain at least either of a nitrogen-containing basic compound (C) and a surfactant (D), were inferior in development defects.

As apparent form the results given in Table 11, the photosensitive resin compositions according to the present invention each was significantly superior in the residual film ratio, resolution, and profile. In contrast, the compositions obtained in Comparative Examples 3c and 4c were inferior in resolution and profile.

As apparent form the results given in Table 12, the photosensitive resin compositions according to the present invention each gave a resist film having excellent dry-etching resistance. In contrast, the resist films obtained from the compositions of Comparative Examples 3c and 4c had poor dry-etching resistance.

The present invention will be explained further in detail by reference to the following Examples, in which polymers having a partial structure represented by formula (Id) were used. However, the invention should not be construed as being limited by these Examples.

SYNTHESIS EXAMPLE 1d (Synthesis of Polymer a-1d)

Into a 2.5-L reaction vessel equipped with a reflux condenser and a Liebig condenser were introduced 780 g of phenol and 118 g of toluene. The contents were heated at 170° C. with refluxing and 110 g of toluene was then distilled off. The system was dehydrated until it came to have a water content of 300 ppm. Subsequently, the system was cooled to 70° C. and 2.6 g of boron trifluoride/phenol complex was added. While the temperature of this reaction mixture was kept at 170° C., 258 g of polybutadiene having a water content of 200 ppm (trade name, "Nisseki Polybutadiene B-1000"; manufactured by Nippon Petrochemicals Co., Ltd.) was gradually dropped therein to over 1 hour. After completion of the addition, the reaction mixture was stirred at 70° C. for 1 hour. Thereafter, 8 g of a hydrotalcite compound (trade name, "KW-1000") manufactured by Kyowa Chemical Industry Co., Ltd. was added and the resultant mixture was stirred for 30 minutes to deactivate the catalyst. The reaction mixture was then filtered through a filter paper covered with a Celite. The clear filtrate thus obtained was distilled at 200° C. under reduced pressure to obtain 280 g of a polymer Ad'.

A solution prepared by dissolving 100 g of the polymer Ad' in 200 g of t-butanol and 3.5 g of a nickel catalyst supported on diatomaceous earth were introduced into an autoclave having a capacity of 1 . The atmosphere in the autoclave was replaced with nitrogen several times and then with hydrogen several times. Thereafter, the hydrogen pressure inside the autoclave was adjusted to 50 kg/cm$^2$, and the contents were heated with stirring and held at 200° C. for 10 hours.

After cooling, the resultant reaction mixture was filtered to remove the catalyst. The filtrate was dropped into a 10-fold amount by weight of water to precipitate a polymer. The precipitated polymer was collected and vacuum-dried at 50° C. to obtain 85 g of a polymer Ad". this polymer Ad" had a weight-average molecular weight of 4,210. The degree of hydrogenation of the phenolic nuclei thereof was calculated through IR and NMR spectormetry, and was found to be 95%.

Subsequently, 53 g of the polymer Ad" and 30 g of 1,2-cyclohexanedicarboxylic anhydride were introduced into a three-necked flask. Thereto was added 300 ml of THF to dissolve those ingredients. Into this solution was gradually dropped 21 g of sodium hydride to react the mixture at 40° C. for 6 hours. The resultant reaction mixture was poured into water to cause crystallization. After the reactants remaining unreacted were removed, the crystals were taken out by filtration and vacuum-dried at 50° C. to obtain 47 g of a polymer Ad'". This polymer Ad'" had a weight-average molecular weight of 5,400.

Furthermore, a mixture of 20 g of the polymer Ad'" and 22 ml of thionyl chloride was refluxed for 1 hour. The excess thionyl chloride was removed, and the residual solid was dissolved in 90 ml of THF. To the solution was gradually added 8.1 g of potassium t-butoxide. This reaction mixture was refluxed for 6 hours, subsequently cooled, and then poured into water. The solid obtained was collected by filtration, washed with water, and then dried under vacuum. This purified reaction product was recrystallized form n-hexane to obtain polymer (a-1d) according to the present invention. This polymer (a-1d) had a weight-average molecular weight of 5,860 and a dispersion degree of 2.5.

SYNTHESIS EXAMPLE 2d (Synthesis of Polymer a-5d)

In 80 g of THF was dissolved 20 g of the polymer Ad'" obtained in Synthesis Example 1d. The dissolved polymer was reacted with 5.2 g of 3,4-dihydro-2H-pyran. The reaction product was coagulated with hexane to obtain polymer (a-5d) according to the present invention. This polymer (a-5d) had a weight-average molecular weight of 5,840 and a dispersion degree of 2.5.

SYNTHESIS EXAMPLE 3d (Synthesis of Polymer a-8d)

The same procedure as in Synthesis Example 1d was conducted, except that fumaric anhydride was used in place of 1,2-cyclohexanedicarboxylic anhydride. Thus, polymer (a-8d) according to the present invention was obtained. This polymer (a-8d) had a weight-average molecular weight of 3,360 and a dispersion degree of 2.1.

EXAMPLES 1d TO 4d AND COMPARATIVE EXAMPLES 1d TO 4d (Preparation of Photosensitive Resin Compositions)

Photosensitive resin compositions were prepared from the ingredients shown in Table 1. Namely, the ingredients used were: a polymer selected from polymers (a-1d), (a-5d), and (a-8d) synthesized in Synthesis Examples 1d to 3d and polymers (b-1) and (b-2) synthesized in Synthesis Examples 5 and 6; triphenylsulfonium triflate (PAG-1) as a photo-acid generator; the acid-decomposable low-molecular compound a synthesized in Synthesis Example 4; a nitrogen-containing basic compound; a surfactant; and a solvent. In Table 13, each broken line means that the ingredient was omitted.

The ingredients were mixed together and the mixture was filtered through a 0.1-μm Teflon filter to prepare a photosensitive resin composition.

The ingredients, when used, were incorporated in the following respective amounts.

| | |
|---|---|
| Polymer | 9.0 g |
| Photo-acid generator | 0.10 g |
| Acid-decomposable low-molecular compound a | 1.0 g |
| Nitrogen-containing basic compound | 0.01 g |
| Surfactant | 0.003 g |
| Solvent | 55.12 g |

TABLE 13

Formulations for positive photosensitive resin compositions

| | Polymer | Photo-acid generator | Acid-decomposable low-molecular compound | Nitrogen containing basic compound | Surfactant | Solvent |
|---|---|---|---|---|---|---|
| Example 1d | (a-1d) | PAG-1 | — | N-1 | W-1 | S-2 |
| Example 2d | (a-5d) | PAG-1 | — | N-2 | W-1 | S-1 |
| Example 3d | (a-8d) | PAG-1 | compound a | N-3 | W-2 | S-2 |
| Example 4d | (a-1d) | PAG-1 | compound a | N-2 | W-2 | S-1 |
| Comparative Example 1d | (a-1d) | PAG-1 | — | — | — | S-1 |
| Comparative Example 2d | (a-5d) | PAG-1 | — | — | W-1 | S-1 |
| Comparative Example 3d | (b-1) | PAG-1 | — | N-1 | W-1 | S-1 |
| Comparative Example 4d | (b-2) | PAG-1 | compound a | N-3 | W-2 | S-2 |

The photosensitive resin compositions thus prepared were evaluated for the number of development defects, image performance of resist, and dry-etching resistance by the same methods as in the preceding Examples. The results of evaluation for development defects, those of evaluation for image performance, and those of evaluation for dry-etching resistance are shown in Tables 14, 15, and 16, respectively.

TABLE 14

| | Number of development defects I | Number of development defects II |
|---|---|---|
| Example 1d | 1 | 2 |
| Example 1d | 2 | 2 |
| Example 2d | 3 | 2 |
| Example 3d | 2 | 0 |
| Example 4d | 1 | 1 |
| Comparative Example 1d | 27 | 43 |
| Comparative Example 2d | 12 | 16 |
| Comparative Example 3d | 5 | 7 |
| Comparative Example 4d | 4 | 4 |

TABLE 15

Image performance of resist

| | Residual Film Ratio (%) | Profile | Threshold resolution (μm) |
|---|---|---|---|
| Example 1d | 99.8 | A | 0.15 |
| Example 2d | 99.7 | A | |
| Example 3d | 99.9 | A | |
| Example 4d | 99.9 | A | |
| Comparative Example 1d | 99.8 | A | 0.15 |
| Comparative Example 2d | 99.7 | A | 0.16 |
| Comparative Example 3d | 98.2 | B | 0.28 |
| Comparative Exaxnple 4d | 97.4 | B | 0.23 |

TABLE 16

Dry-etching resistance of resist; rate of dry etching

| | Rate of etching (Å/min) |
|---|---|
| Example 1d | 740 |
| Example 2d | 780 |
| Example 3d | 710 |
| Example 4d | 700 |
| Comparative Example 1d | 740 |
| Comparative Example 2d | 780 |
| Comparative Example 3d | 980 |
| Comparative Example 4d | 930 |

As apparent from the results given in Table 14, the photosensitive resin compositions according to the present invention each gave a resist film having few development defects. In contrast, the compositions obtained in Comparative Examples 1 and 2, which did not contain at least either of a nitrogen-containing basic compound (C) and a surfactant (D), were inferior in development defects.

As apparent form the results given in Table 15, the photosensitive resin compositions according to the present invention each was significantly superior in the residual film ratio, resolution, and profile. In contrast, the compositions obtained in Comparative Examples 3 and 4 were inferior especially in resolution and profile.

As apparent form the results given in Table 16, the photosensitive resin compositions according to the present invention each gave a resist film having excellent dry-etching resistance. In contrast, the resist films obtained from the compositions of Comparative Examples 3 and 4 had poor dry-etching resistance.

As demonstrated above, the positive photosensitive resin compositions of the present invention develop few development defects and are satisfactory in the residual film ratio, pattern profile, and resolution especially when exposed to ArF excimer laser light. In addition, the resist films obtained therefrom have excellent dry-etching resistance. Therefore, the compositions can be effectively used in forming fine patterns necessary for producing semiconductor elements.

While the invention has been described in detail and with reference to specific embodiments thereof, it will be apparent to one skilled in the art that various changes and modifications can be made therein without departing form the spirit and scope thereof.

What is claimed is:

1. A positive photosensitive resin composition comprising:
   (A) a compound which generates an acid upon irradiation with acitinic rays,
   (B) a polymer having a partial structure represented by the following general formula (Ia),
   (C) a nitrogen-containing basic compound, and
   (D) at least one of a fluorine surfactant and a silicone surfactant:

general formula (Ia)

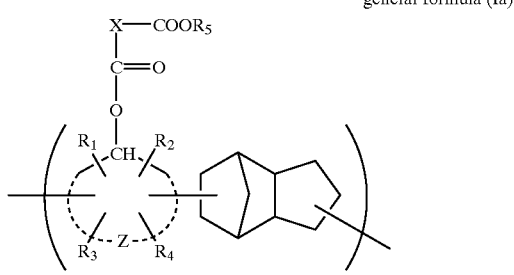

wherein $R_1$ to $R_4$ each independently represents a hydrogen atom, a hydroxyl group, a carboxyl group, an alkyl group, an alkoxy group, a substituted alkyl group, a substituted alkoxy group, or a cycloalkyl group, provided that either $R_1$ and $R_3$ or $R_2$ and $R_4$ may be bonded to each other to form a ring;
   X represents a bivalent organic group having 2 to 20 carbons atoms; $R_5$ represents a hydrogen atom, an alkyl group, a substituted alkyl group, a cycloalkyl group, a substituted cycloalkyl group, or such a group that the —$COOR_5$ functions as a group which decomposes by the action of an acid; and
   Z represents a group of atoms which forms a cyclohexene or decalin ring in cooperation with the carbon atom.

2. The positive photosensitive resin composition of claim 1, wherein the polymer (B) has groups which decompose by the action of an acid.

3. The positive photosensitive resin composition of claim 1, which further contains a low-molecular, acid-decomposable, dissolution inhibitive compound having a molecular weight of 2,000 or lower which has one or more groups decomposable by the action of an acid and comes to have enhanced alkali solubility by the action of an acid.

4. The positive photosensitive resin composition of claim 1, wherein the acitinic rays are far ultraviolet rays having a wavelength of 220 nm or shorter.

5. A positive photosensitive resin composition comprising:
   (A) a compound which generates an acid upon irradiation with acitinic rays,
   (B) a polymer having a partial structure represented by the following general formula (Ib),
   (C) a nitrogen-containing basic compound, and
   (D) at least one of a fluorine surfactant and a silicone surfactant:

general formula (Ib)

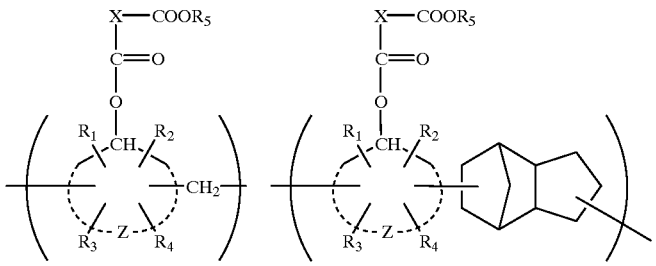

wherein $R_1$ to $R_4$ each independently represent a hydrogen atom, a hydroxyl group, a carboxyl group, an alkyl group, an alkoxy group, a substituted alkyl group, a substituted alkoxy group, or a cycloalkyl group, provided that either $R_1$ and $R_3$ or $R_2$ and $R_4$ may be bonded to each other to form a ring;
   X represents a bivalent organic group having 2 to 20 carbon atoms;
   $R_5$ represents a hydrogen atom, an alkyl group, a substituted alkyl group, a cycloalkyl group, a substituted cycloalkyl group, or such a group that the —$COOR_5$ functions as a group which decomposes by the action of an acid; and
   Z represents a group of atoms which forms a cyclohexene or decalin ring in cooperation with the carbon atom.

6. The positive photosensitive resin composition of claim 5, wherein the polymer (B) has groups which decompose by the action of an acid.

7. The positive photosensitive resin composition of claim 5, which contains a low-molecular, acid-decomposable, dissolution inhibitive compound having a molecular weight of 2,000 or lower which has one or more groups deocmposable by the action of an acid and comes to have enhanced alkali solubility by the action of an acid.

8. The positive photosensitive resin composition of claim 5, wherein the acitinic rays are far ultraviolet rays having a wavelength of 220 nm or shorter.

9. A positive photosensitive resin composition comprising:
   (A) a compound which generates an acid upon irradiation with acitinic rays,
   (B) a polymer having a partial structure represented by the following general formula (Ic),
   (C) a nitrogen-containing basic compound, and (D) at least one of a fluorine surfactant and a silicone surfactant:

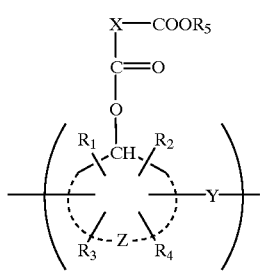

general formula (Ic)

wherein $R_1$ to $R_4$ each independently represent a hydrogen atom, a hydroxyl group, a carboxyl group, an alkyl group, an alkoxy group, a substituted alkyl group, a substituted alkoxy group, or a cycloalkyl group, provided that either $R_1$ and $R_3$ or $R_2$ and $R_4$ may be bonded to each other to form a ring;

X represents a bivalent organic group having 2 to 20 carbon atoms;

$R_5$ represents a hydrogen atom, an alkyl group, a substituted alkyl group, a cycloalkyl group, a substituted cycloalkyl group, or such a group that the —$COOR_5$ functions as a group which decomposes by the action of an acid;

Z represents a group of atoms which forms a cyclohexene or decalin ring in cooperation with the carbon atom; and Y represents

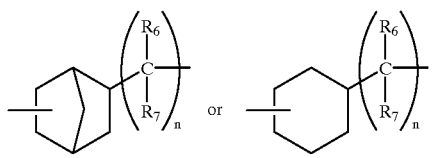

wherein $R_6$ and $R_7$ each independently represents a hydrogen atom or a methyl group and n represents 1 or 2.

10. The positive photosensitive resin composition of claim 9, wherein the polymer (B) has groups which decompose by the action of an acid.

11. The positive photosensitive resin composition of claim 9, which further contains a low-molecular, acid-decomposable, dissolution inhibitive compound having a molecular weight of 2,000 or lower which has one or more groups decomposable by the action of an acid and comes to have enhanced alkali solubility by the action of an acid.

12. The positive photosensitive resin composition of claim 9, wherein the acitinic rays are far ultraviolet rays having a wavelength of 220 nm or shorter.

13. A positive photosensitive resin composition comprising:

(A) a compound which generates an acid upon irradiation with acitinic rays, (B) a polymer having a partial structure represented by the following general formula (Id), (C) a nitrogen-containing basic compound, and (D) at least one of a fluorine surfactant and a silicone surfactant:

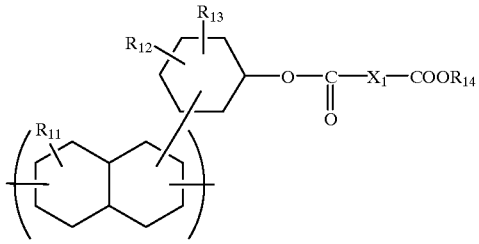

general formula (Id)

wherein $R_{11}$ represents a methyl group or an ethyl group; $R_{12}$ and $R_{13}$ each independently represents a hydroxyl group, a carboxyl group, an alkyl group, an alkoxy group, a substituted alkyl group, a substituted alkoxy group, or a cycloalkyl group, provided that $R_{12}$ and $R_{13}$ may be bonded to each other to form a ring; $X_1$ represents a bivalent organic group having 2 to 20 carbon atoms; and $R_{14}$ represents a hydrogen atom, an alkyl group, a substituted alkyl group, a cycloalkyl group, a substituted cycloalkyl group, or such a group that the —$COOR_{14}$ functions as a group which decomposes by the action of an acid.

14. The positive photosensitive resin composition of claim 13, wherein the polymer (B) has groups which decompose by the action of an acid.

15. The positive photosensitive resin composition of claim 13, which further contains a low-molecular, acid-decomposable, dissolution inhibitive compound having a molecular weight of 2,000 or lower which has one or more groups decomposable by the action of an acid and comes to have enhanced alkali solubility by the action of an acid.

16. The positive photosensitive resin composition of claim 13, wherein the acitinic rays are far ultraviolet rays having a wavelength of 220 nm or shorter.

* * * * *